United States Patent [19]

Toma et al.

[11] Patent Number: 5,397,401
[45] Date of Patent: Mar. 14, 1995

[54] SEMICONDUCTOR APPARATUS COVERED WITH A SEALING RESIN COMPOSITION

[75] Inventors: Hitoshi Toma, Kawasaki; Toshihiko Mimura, Nara; Nobuyoshi Takehara; Koji Tsuzuki, both of Kyoto, all of Japan

[73] Assignee: Canon Kabushiki Kaisha, Tokyo, Japan

[21] Appl. No.: 82,859

[22] Filed: Jun. 28, 1993

[30] Foreign Application Priority Data

| Jun. 29, 1992 | [JP] | Japan | 4-194792 |
| Jun. 29, 1992 | [JP] | Japan | 4-194793 |
| Jun. 29, 1992 | [JP] | Japan | 4-194794 |
| Jun. 29, 1992 | [JP] | Japan | 4-194795 |
| Nov. 17, 1992 | [JP] | Japan | 4-307234 |

[51] Int. Cl.$^6$ .............. H01L 31/048; H01L 31/0203
[52] U.S. Cl. ................. 136/259; 136/251; 257/433; 257/788; 257/789
[58] Field of Search .......... 136/251, 259; 257/433, 257/788–789, 793–795

[56] References Cited

U.S. PATENT DOCUMENTS

| 3,957,531 | 5/1976 | Tipping et al. | 134/11 |
| 3,957,537 | 5/1976 | Baskett et al. | 136/251 |
| 4,216,035 | 5/1980 | Bakos et al. | 148/23 |
| 4,499,658 | 2/1985 | Lewis | 437/2 |
| 4,636,578 | 1/1987 | Feinberg | 136/251 |
| 4,692,557 | 9/1987 | Samuelson et al. | 136/251 |

FOREIGN PATENT DOCUMENTS

| 0002725 | 7/1979 | European Pat. Off. |
| 0024615 | 3/1981 | European Pat. Off. |
| 2001918 | 10/1969 | France |
| 2244266 | 4/1975 | France |
| 58-17685 | 2/1983 | Japan | 136/251 |
| 62-187862 | 8/1987 | Japan |
| 1-11355 | 1/1989 | Japan | 257/789 |
| 1-060677 | 3/1989 | Japan |
| 1252601 | 10/1971 | United Kingdom |

OTHER PUBLICATIONS

D. C. Carmichael et al, *Conf. Record, 12th IEEE Photovoltaic Specialists Conference* (1976), pp. 317–331.
W. Carroll et al, ibid., pp. 332–339.

*Primary Examiner*—Aaron Weisstuch
*Attorney, Agent, or Firm*—Fitzpatrick, Cella, Harper & Scinto

[57] ABSTRACT

A sealing material exhibiting excellent sealing performance while keeping a satisfactory balance between a variety of characteristics is provided so that the sealing structure is simplified and the quantity of the sealing material is reduced. As a result, a solar cell, the cost of which can significantly be reduced and which can be operated stably for a long time while exhibiting excellent performance can be provided. A suitable resin composition for sealing contains at least a hardening resin and a thermoplastic resin which has a number average molecular weight larger than the number average molecular weight of the hardening resin and which is soluble in the hardening resin.

23 Claims, 3 Drawing Sheets

SEMICONDUCTOR APPARATUS COVERED WITH A SEALING RESIN COMPOSITION

BACKGROUND OF THE INVENTION

1. Field of the Invention

The present invention relates to a resin composition for sealing and a semiconductor apparatus covered with the resin composition, and more particularly to a resin composition for sealing which is capable of protecting a semiconductor or the like from various external environmental conditions such as rain, ultraviolet rays, dust and moisture, and to a semiconductor apparatus covered with the resin composition.

2. Related Background Art

In order to overcome the energy crisis which will occur due to a future lack of ability to supply energy because of rapid increase in energy demand or global environmental disruption due to warming caused by the greenhouse effect and an increase in carbon dioxide, an energy supply source which is benign to the environment has been desired.

In particular, solar cells, which are a clean and safe energy source capable of continuously supplying energy for a long time, provide the greatest expectation to meet the foregoing desire.

Solar cells comprise energy generating elements utilizing the photovoltaic effect of semiconductors. In a general way, the following various photovoltaic elements are well-known.

(1) Crystal-type Photovoltaic Element

A photovoltaic element manufactured by doping n or p-type impurities into a wafer made of a p or n-type single or poly-crystal substance to form a pn-junction.

(2) Amorphous Silicon Type Photovoltaic Element

A photovoltaic element having a pin junction formed by decomposing a silane gas with heat or high frequency electric field or light so that amorphous silicon is deposited, and at this time by introducing $B_2H_6$ or $BF_3$ gas as a p-type doping material together with the silane gas in the case where a p-type semiconductor is formed or similarly introducing $PH_3$ or the like as an n-type doping material in the case where an n-type semiconductor is formed.

(3) Compound Semiconductor Photovoltaic Element

A photovoltaic element having a pn-junction formed by epitaxial liquid-phase deposition of p-type GaAs on n-type GaAs or a photovoltaic element having the pn-junction formed by stacking and baking layers of n-type CdS and p-type CdTe.

Further, a $CuInSe_2$ photovoltaic element and an n-type CdS/p-type $CuInS_2$ photovoltaic element and the like are known.

The foregoing solar cells must operate stably for 20 to 30 years in an outdoor environment irradiated with sunlight. In a special case, solar cells must stably operate under extreme vacuum pressure such as in space.

In the foregoing operational environments, stable operation is prevented due to the following various environmental factors.

The output of the solar cell is undesirably reduced due to the following major factors:

(1) Damage to the solar cell due to the incident energy of ultraviolet rays, light, and other electromagnetic waves.
(2) Corrosion and local structure breakdown of the solar cell due to rain and moisture in the air.
(3) Deterioration of the light transmittance due to adhesion of dust and contamination of the surface.
(4) Local structural breakdown occurring due to collision of stones or dust particles on the surface of the solar cell.

As for safety, there arises a problem of deterioration of the electric insulation due to rain and moisture in the air.

In order to eliminate the factors preventing the safe operation of the solar cell, such as the foregoing factors, which form a fraction of all of the factors causing the deterioration in the output, the photoelectrical conversion surface and the non-photoelectrical conversion surface of the photovoltaic element must be covered with a protective film.

Some methods of covering the surfaces with a protective film have been suggested. For example, U.S. Pat. No. 3,957,537 discloses a technology in which a thermotype adhesive agent typified by polyvinyl butyryl resin and a ternary copolymer of ethylene-methylmethacrylate-methacrylic acid is used at an intermediate position of the laminate and a glass plate or the like is used to form the external surface whereby sealing is realized.

However, solar cells are usually heated to a temperature of about 80° C. to 100° C. in the sunshine. The foregoing thermo adhesive agent is excessively plasticized at the foregoing temperature and, accordingly, its adhesive force rapidly deteriorates. As a result, separation and deformation take place. Therefore, the separated or deformed portion allows rain and moisture to invade, causing the operation of the solar cell to deteriorate excessively. The solar cell is rapidly cooled at night in the absence of sunshine. For example, the solar cell is cooled to tens of degrees below zero at night in an extreme case.

As described above, the temperature is sometimes changed from a high temperature region of +80° C. to 100° C. to a low temperature region of tens of degrees below zero between day and night. Therefore, the solar cell is placed under a severe temperature variation in which high temperature and low temperature alternate. As a result, structural materials are expanded and contracted repeatedly, causing the separation of the thermo adhesive agent to be enhanced. Therefore, the operation of the solar cell deteriorates due to rain and moisture.

From this viewpoint, there has been a desire of improving the temperature characteristics and adhesive force of the materials for sealing the photovoltaic element.

There is known a conventional technology in which a primer is used together with the adhesive agent in order to increase the adhesive force.

U.S. Pat. No. 4,499,658 has disclosed a technology in which a silicone type primer and a cross-linking agent such as a peroxide are added to a binary copolymer of ethylene and vinyl acetate or polyvinyl butyryl resin to increase the adhesive force and to improve the temperature characteristics.

However, the foregoing sealing material has not satisfactorily achieved the characteristics required to seal the photovoltaic element.

Since the basic sealing material using the thermo adhesive agent is relatively soft, it can easily be damaged. Therefore, the sealing material of the foregoing type cannot satisfactorily withstand mechanical impact. Since the sealing material is basically an adhesive agent, dust can easily adhere to it, causing the light transmissivity to easily deteriorate. In order to prevent the deterioration of the light transmissivity, glass or a fluorine type polymer film usually must be stacked on the surface of the sealing material. As a result, the sealing structure becomes too complicated and, accordingly, the manufacturing cost is increased.

What is worse, a large quantity of the sealing material must be used because of the foregoing reasons and cannot therefore be reduced. The foregoing prevents the wide use of the solar cells.

In order to overcome the foregoing problems, a method of sealing photovoltaic elements using a hardening resin selected from a variety of hardening resins has been examined, in which the sealing material has sufficient strength in order to simplify the sealing structure and reduce the quantity of the sealing material required, thereby significantly reducing the sealing cost and improving the sealing performance.

However, the hardening resin has unsatisfactory adhesion and, accordingly, it is easily separated. What is worse, the hardening resin encounters problems of deterioration in adhesive force due to high temperature, change in the temperature, rain and moisture, fatigue due to light, decrease of light transmissivity due to decolorizing, and unsatisfactory brittleness. Therefore, the hardening resin cannot satisfactorily seal the photovoltaic element while maintaining a good balance of characteristics.

SUMMARY OF THE INVENTION

An object of the present invention is to provide a sealing material exhibiting excellent sealing performance while keeping a satisfactory balance among a variety of characteristics thereof.

Another object of the present invention is to provide a solar cell and the like, the sealing structure of which can be simplified to reduce the required quantity of the sealing material and the cost of which can be significantly reduced, so that the solar cell operates stably for a long time while exhibiting excellent performance.

According to a first aspect of the present invention, there is provided a sealing material for a solar cell or the like made of a resin composition for sealing containing at least a hardening resin and a thermoplastic resin which has a number average molecular weight larger than the number average molecular weight of the hardening resin and which is soluble in the hardening resin.

According to a second aspect of the present invention, there is provided a sealing material for a solar cell or the like made of a resin composition for sealing comprising: a hardening resin; and a thermoplastic resin which has a number average molecular weight of the hardening resin and which is soluble in the hardening resin, wherein the hardening resin is a polymer having an acrylic group or an acrylic group which has a substituent at the $\alpha$ or $\beta$ position and the thermoplastic resin is a styrene polymer.

According to a third aspect of the present invention, there is provided a sealing material for a solar cell or the like made or a resin composition for sealing comprising: a hardening resin; and a thermoplastic resin which has a number average molecular weight larger than the number average molecular weight of the hardening resin and which is soluble in the hardening resin, wherein the hardening resin is a polymer having an acrylic group or an acrylic group which has a substituent at the $\alpha$ or $\beta$ position and the thermoplastic resin is an acrylic polymer.

According to a fourth aspect of the present invention, there is provided a sealing material for a solar cell or the like made of a resin composition for sealing comprising: a hardening resin; and a thermoplastic resin which has a number average molecular weight larger that the number average molecular weight of the hardening resin and which is soluble in the hardening resin, wherein the hardening resin is a polymer having an acrylic group or an acrylic group which has a substituent at the $\alpha$ or $\beta$ position and the thermoplastic resin is a styrene-acrylic polymer.

According to a fifth aspect of the present invention, there is provided a sealing material for a solar cell or the like made of a resin composition for sealing comprising: at least one type of resin selected from a group selected from a group consisting of a hardening resin and a plastic resin and light transmissive particles as the main component, wherein the proportion of the content of the resin is 1.5 times or more the quantity of oil absorbed in the light transmissive particles.

According to another aspect of the present invention, there is provided a sealing material for a solar cell or the like made of a resin composition for sealing comprising: a hardening resin having reactivity and having a small molecular weight; a thermoplastic resin which has a number average molecular weight larger than the number average molecular weight of the hardening resin and which is soluble in the hardening resin; and light transmissive particles as the main components, wherein the total content of the hardening resin and the thermoplastic resin is 1.5 times or more the quantity of oil absorbed in the light transmissive particles.

According to another aspect of the present invention, there is provided a semiconductor apparatus which is partially or fully covered with the foregoing resin composition.

Other and further objects, features, and advantages of the invention will be apparent more fully from the following description.

DETAILED DESCRIPTION OF THE PREFERRED EMBODIMENTS

Figure 1:
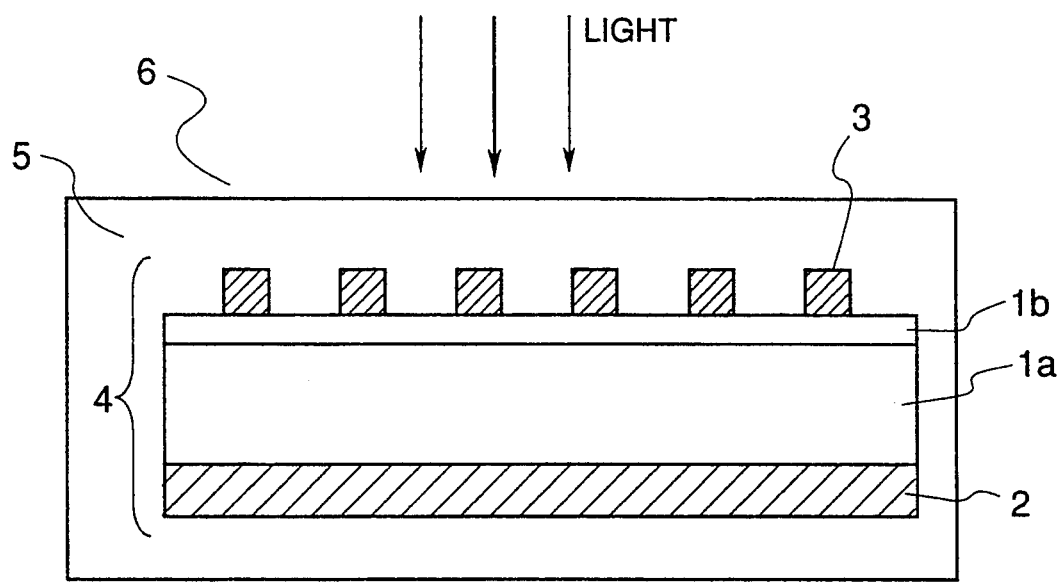
FIG. 1 is a schematic cross sectional view which illustrates an example of a solar cell which uses a sealing material according to the present invention.

In the present invention, "soluble in a hardening resin" means a state where a relatively high molecular thermoplastic resin is uniformly dispersed in micron sizes or uniformly dissolved at a molecular level in the hardening resin. From the optical viewpoint, the foregoing dissolved state is defined by a uniformly dispersed and somewhat turbid state (for micron sized particles) or a uniformly mixed and transparent state (at the molecular level). The soluble state is composed of the low molecular weight hardening resin and high molecular weight thermoplastic resin. Therefore, the following advantages of the hardening resin can be obtained:

1. Excellent heat resistance
2. Good hardness characteristics and damage prevention resulting from it
3. Excellent water and moisture resistance
4. Excellent electric insulating characteristics Further, the following disadvantages of the hardening resin can be significantly eliminated:

1. Unsatisfactory brittleness and impact resistance
2. Limited adhesion with respect to some kinds of materials and undesirably easy separation
3. Rapid deterioration due to light, occurrence of cracks and separation, and deterioration of the light transmissivity
4. Unsatisfactory flexibility, heat and impact resistance, and excessive brittleness at low temperature Therefore, the foregoing material can be employed as a satisfactory material for sealing the photovoltaic element which is capable of realizing the desired characteristics while maintaining an excellent balance between them. Basically, a single thin film layer made of the resin composition according to the present invention is able to sufficiently seal a photovoltaic element for a long time while allowing a stable operation. Further, the sealing process can be significantly simplified and the quantity of the sealing material can be reduced to 1/10 to 1/1000. Therefore, the sealing cost can be significantly reduced.

As a result, a solar cell exhibiting excellent physical properties and with reduced cost can be provided.

The hardening resin for use in the present invention is a resin which is hardened when heat or active energy is supplied. The hardening resin is exemplified by unsaturated polyester resin, phenol resin, alkyd resin, unsaturated acrylic resin, epoxy resin, polyurethane resin, melamine resin, diaryl phthalate resin, their oligomers, derivatives, or the like. The foregoing materials may be used solely or combined with each other to obtain desired effects.

The compatibility between the hardening resin and the thermoplastic resin enables the thermoplastic resin to be surrounded by the hardening resin (an assumption is made that the molecules of the thermoplastic resin are expanded linearly while preventing the formation of a ball of molecules) so that an excellent resin composition for sealing a solar cell or the like is obtained.

When the hardening resin is a polymer or oligomer having an acrylic group or an acrylic group which has a substituent at the $\alpha$ or $\beta$ position and the thermoplastic resin is a styrene type polymer or an acrylic polymer, the resin composition for sealing a solar cell or the like has excellent characteristics.

The polymer or oligomer having a polymerizable acrylic group or an acrylic group having a substituent at the $\alpha$ or $\beta$ position is exemplified by acrylate ester oligomer, acrylate ester polymer, methacrylate ester oligomer, methacrylate ester polymer, acrylate epoxy oligomer, acrylate epoxy polymer, methacrylate ester oligomer, methacrylate ester polymer, acrylate epoxy oligomer, acrylate epoxy polymer, methacrylate epoxy oligomer, methacrylate epoxy polymer, acrylate urethane oligomer, acrylate urethane polymer, methacrylate urethane polymer, acrylate melamine oligomer, acrylate melamine polymer, methacrylate melamine oligomer and methacrylate melamine polymer. Any one of the foregoing materials may be used solely or combined with each other to obtain desired effects.

The experiments conducted by the inventors determined that a large molecular weight of the hardening resin causes the performance of the hardening resin for dissolving the thermoplastic resin to gradually deteriorate and the reinforcing effect realized by the thermoplastic resin deteriorates. Therefore, the preferred molecular weight of the hardening resin is 3000 or less in terms of the number average molecular weight (obtained by a well-known gel permeation chromatogram while referring to standard polystyrene), more preferably 200 to 3000.

The energy for hardening may be heat, light, or an electron beam. A two-liquid mixture type substance may be hardened by mixing.

The thermoplastic resin according to the present invention may be a material selected from a group consisting of saturated polyester resin, phenol resin, acrylic resin, styrene resin, epoxy resin, urethane resin, vinyl acetate resin, vinyl chloride resin, vinyl alcohol resin, acetal resin, their derivative resins and their copolymerized resins. Any one of the foregoing materials may be used solely or they may be combined with each other to obtain desired effects.

The styrene polymer according to the present invention is a polymer, the monomer of which is styrene or a styrene derivative or the like. The styrene copolymer is exemplified by polystyrene homopolymer, styrene butadiene copolymer, styrene-acrylnitryl copolymer, and styrene-butadiene-acrylnitryl copolymer.

The acrylic polymer according to the present invention is a polymer composed of one or a plurality of monomers of acrylic acid or acrylic ester or their derivatives, or methacrylic acid or methacrylic ester or their derivatives or a copolymer, the main component of which is the foregoing monomer. The acrylic polymer is exemplified by the following polymers: acrylic ester homopolymer, acrylic ester copolymer, acrylic acid.acrylic ester copolymer, methacrylic ester homopolymer, methacrylic ester copolymer, methacrylic acid.methacrylic ester copolymer, methacrylic acid.acrylic ester copolymer, acrylic acid.methacrylic ester copolymer, methacrylic acid.acrylic acid.acrylic ester copolymer, methacrylic acid.acrylic acid.methacrylic ester copolymer, and methacrylic acid.acrylic acid.methacrylic ester.acrylic ester copolymer.

The acrylic ester is a monomer exemplified by acrylic acid methyl ester, acrylic acid ethyl ester, acrylic acid propyl ester, acrylic acid butyl ester, acrylic acid octyl ester, acrylic acid dodecyl ester, and acrylic acid hexadecyl ester. Their derivatives are exemplified by a monomer such as acrylic acid dihydroperfluorobutyl ester or a monomer into which a substituent is introduced into the foregoing monomer.

The methacrylic ester is a monomer such as methacrylic acid methyl ester, methacrylic acid ethyl ester, methacrylic acid propyl ester, methacrylic acid isopropyl ester, methacrylic acid butyl ester, methacrylic acid sec-butyl ester, methacrylic acid tert-butyl ester, methacrylic acid isobutyl ester, methacrylic acid aryl ester, methacrylphenyl ester, and methacrylic acid benzyl ester. Their derivatives are exemplified by a monomer of a type in which a substituent is introduced into the foregoing monomer.

The styrene.acrylic polymer is one or more monomers of styrene or a styrene derivative or a copolymer composed of one or a plurality of monomers of acrylic acid, acrylic ester, their derivatives or methacrylic acid or methacrylic ester or their derivatives or a copolymer, the main component of which is the foregoing monomer. The styrene.acrylic polymer is exemplified by styrene acrylic ester copolymer, styrene acrylic acid acrylic ester copolymer, styrene methacrylic ester homopolymer, styrene methacrylic ester copolymer, styrene methacrylic acid methacrylic ester copolymer, styrene methacrylic acid acrylic ester copolymer, styrene acrylic acid methacrylic ester copolymer, styrene methacrylic acid acrylic acid acrylic ester copolymer, styrene methacrylic acid acrylic acid methacrylic ester copolymer, and styrene methacrylic acid acrylic acid methacrylic ester acrylic ester copolymer.

The acrylic ester is exemplified by a monomer such as acrylic acid methyl ester, acrylic acid ethyl ester, acrylic acid propyl ester, acrylic acid butyl ester, acrylic acid octyl ester, acrylic acid dodecyl ester, and acrylic acid hexadecyl ester. Their derivatives are exemplified by a monomer such as acrylic acid dihydroperfluorobutyl ester of a monomer of a type in which a substituent is introduced into the foregoing monomer.

The methacrylic ester is a monomer such as methacrylic acid methyl ester, methacrylic acid ethyl ester, methacrylic acid propyl ester, methacrylic acid isopropyl ester, methacrylic acid butyl ester, methacrylic acid sec-butyl ester, methacrylic acid tert-butyl ester, methacrylic acid isobutyl ester, methacrylic acid acryl ester, methacrylphenyl ester, and methacrylic acid benzyl ester. Their derivatives are exemplified by a monomer of a type in which a substituent is introduced into the foregoing monomer.

It was found from experiments that, if the molecular weight of the thermoplastic resin is too small, the quantity dissolved in the hardening resin is increased but the length of the molecule is shortened, causing the reinforcing effect to deteriorate. As a result, a preferred number average of the thermoplastic resin is 5000 or more, more preferably 5000 to 50,000.

As for the molecular shape, excellent effects were obtained for the characteristics when the shape includes a small number of branched structures and a straight-chain bonding structure.

The method of dissolving the thermoplastic resin into the hardening resin is exemplified by a method in which the thermoplastic resin is dissolved into the hardening resin while stirring the thermoplastic resin and a method in which both of the foregoing resins are dissolved in an organic solvent such as toluene, alcohol, ketone, or ester. The hardening energy may be heat, light, or an electron beam. At this time, a thermal polymerization initiator such as alkyl peroxy ester, dialkyl peroxide, peroxy ketal or peroxy dicarbonate or a light polymerization initiator may be used simultaneously. If necessary, a so-called reactive monomer serving as a polymerization enhancing agent such as hexamethylene diacrylate or trimethylolpropane triacrylate may be added. In this case, the characteristics are not adversely affected.

It is preferable that the thermoplastic resin according to the present invention is 20 to 85 wt % of the total quantity of the thermoplastic resin and the hardening resin.

One of the excellent features of the resin composition according to the present invention is that no polymerization initiator is required to effect hardening or that the quantity of the same can be significantly reduced. As a result, a variety of adverse effects caused by the polymerization initiator can be reduced significantly. Hence, the following effects can be obtained: excellent light transmissivity is realized, decoloration such as turning yellow due to light can be prevented considerably and mechanical and optical deterioration in the physical properties such as strength and devitrification can be reduced. Therefore, the resin composition according to the present invention is an optimum sealing resin for sealing a photovoltaic element, a photosensor, and a display element which must be stable for a long time.

The sealing material according to the present invention is formed on the photoelectric conversion surface or the non-photoelectric conversion surface of the photovoltaic element or the like by a method comprising dipping the photovoltaic element into a fluid solution of the resin composition according to the present invention, removing it, and using a hardening energy means selected from a group consisting of heat, light and electron beam. As an alternative to this, a coating method using roller coating, spray coating or electrostatic painting may be employed.

The necessity of using the same resin composition on the photoelectric conversion surface and the non-photoelectric conversion surface of the photovoltaic element or the like may be eliminated. Even if they are different from each other but are adaptable to the shape of the solar cell or the like, the effects of the present invention can be obtained satisfactorily. A multi-layer sealing structure may be employed in which glass, ethylene-tetrafluoroethylene film, or a metal plate (a back support plate) or the like is stacked on the sealing resin according to the present invention. In this case, the effects of the present invention can be obtained satisfactorily. A multi-layer sealing structure in which another resin layer is formed between the photovoltaic element and the sealing resin according to the present invention may also be employed.

Since a resin composition according to the present invention contains light transmissive particles as well as the resin, a surface tension and a mutual effect are generated between the resin and the particles. Further, the foregoing particles enable a spacer-like effect to be obtained.

Usually, the solar cell is structured so that a layer made of thin crystal foil or metal foil is formed on a supporting member thereof. Further, a collecting electrode such as a grid, a bus bar, or a back electrode is sometimes disposed on the surface of the solar cell. As a result, the portions of the solar cell to be covered have many fine projections and pits, for example, those in the supporting member, those in the peripheral edge portions of each layer, and those in the collecting electrode portion. When fine projections and pits of the foregoing type are sealed by only the resin, there is a tendency that the thickness of the sealing material film becomes too thin at the edge portions of the projections and pits and only a sealing film having many pinholes can be obtained due to the surface tension of the resin and the manufacturing process for covering the solar cell.

According to the present invention, the resin can cover the edges of the projections and pits due to the surface tension between the foregoing resin and particles, the mutual effect, and the spacer-like effect of the particles. Therefore, thinning of the film in the edge portion can be prevented. That is, the levelling characteristics can be improved and, accordingly, a precise film in which the pinholes can be reduced can be formed. As a result, the foregoing objects can be realized.

The present invention is also characterized by the proportion of the resin content being 1.5 times or more than the quantity of oil absorbed into the transmissive particles. The quantity of oil absorbed in the particles is a parameter indicative of the quantity with which the space between the light transmissive particles is filled with the resin. A composition having a resin content equivalent to the quantity of the oil absorption is normally a desired condition, with which a film having no gaps can be formed. According to the inventors, a resin content equivalent to the oil absorption is insufficient to obtain satisfactory physical properties for a special application, that is, sealing of a solar cell. By using a large quantity of the resin i.e., one which is 1.5 times or more the quantity of the absorbed oil, an excellent effect can be obtained. If the quantity of the resin is too small, resin regions cannot be formed sufficiently and, accordingly, the light transmissive particles are in direct contact with one another. If a large quantity of the resin is used, the spaces between the light transmissive particles are sufficiently filled with the resin.

In a case where a low molecular weight hardening resin and thermoplastic resin having a number average molecular weight larger than the number average molecular weight of the hardening resin and soluble in the hardening resin are used together, a state is realized in which the relatively high molecular weight thermoplastic resin is uniformly dispersed in the hardening resin in the micron size or uniformly dissolved in the same at the molecular level. As a result, the advantages of the hardening resin, that is, excellent heat resistance, damage resistance, water and moisture resistance, and electric insulation can be maintained. Further, the following disadvantages of the hardening resin an be significantly improved: it is too brittle and its impact resistance is unsatisfactory, the adhesion is limited to particular materials and separation takes place easily, cracks and separation occur due to light deterioration and deterioration in the light transmissivity readily occurs, its poor flexibility causes the mechanical impact strength and the temperature resistance to be unsatisfactory and it is easily made brittle even though the temperature is not high. As a result, the foregoing objects can be further satisfactorily achieved.

In this invention, a resin selected from each of the foregoing groups of the hardening resins and the thermoplastic resins are used in combination.

In the case where the hardening resin and the thermoplastic resin are used together in such a manner that a hardening resin having reactivity and a low molecular weight is used and a thermoplastic resin having a number average molecular weight larger than the number average molecular weight of the hardening resin and soluble in the hardening resin is used, the thermoplastic resin can be uniformly dispersed or dissolved in the hardening resin. Therefore, the disadvantages of the hardening resin can be overcome by the thermoplastic resin while maintaining the advantages of the hardening resin. Therefore, the overall characteristics can be significantly improved.

In this case, a hardening resin of a type having a low molecular weight is employed. That is, the hardening resin must have a small molecular weight so that the thermoplastic resin can be satisfactorily dissolved therein while preventing separation and permitting the desired effect to be obtained from the thermoplastic resin. Although the optimum molecular weight depends upon the particular conditions, it is preferable that the number average molecular weight (standard polystyrene is made the standard) is 3000 or less via gel permeation chromatography, more preferably 200 to 3000.

The thermoplastic resin for use in this case must have a number average molecular weight larger than the number average molecular weight of the hardening resin and be soluble in the hardening resin. If the number average molecular weight is too small, the length of the molecules is too short to obtain a desired reinforcing effect although the amount which is soluble in the hardening resin is increased. Although the optimum molecular weight depends upon the conditions, it is preferable that the molecular weight (using standard polystyrene as the standard) is 5000 or more via gel permeation chromatography. Although there is no upper limit of the average number molecular weight, it is preferably 50,000 or less. As for the molecular form of the thermoplastic resin, excellent characteristics are obtained when a form is employed which includes a small number of branched structures and a straight-chain bonding structure. The fact that the thermoplastic resin is soluble in the hardening resin means that a relatively high molecular thermoplastic resin can be uniformly dispersed in micron sizes or uniformly dissolved at a molecular level in the hardening resin. From an optical viewpoint, it is defined by a uniformly dispersed and somewhat turbid state of micron sized particles or a uniformly mixed and transparent state at a molecular level.

It is preferable that the hardening resin is a polymer having an acrylic group or an acrylic group which comprises a substituent at the $\alpha$ or $\beta$ position and the thermoplastic resin is a styrene-type polymer. The compatibility between the hardening resin and the thermoplastic resin enables the thermoplastic resin to be surrounded by the hardening resin in an extremely satisfactory state (an assumption is made that molecules of the thermoplastic resin are expanded linearly while preventing formation of a ball of molecules) so that an excellent resin composition for sealing a solar cell is obtained.

The polymer having an acrylic group or an acrylic group which comprises a substituent at the $\alpha$ or $\beta$ position is exemplified by acrylate oligomer, acrylate polymer, methacrylate oligomer, methacrylate polymer, acrylate epoxy oligomer, acrylate epoxy polymer, methacrylate epoxy oligomer, methacrylate epoxy polymer, acrylate urethane oligomer, acrylate urethane polymer, methacrylate urethane oligomer, methacrylate urethane polymer, acrylate melamine oligomer, acrylate melamine polymer, methacrylate melamine oligomer, and methacrylate melamine polymer and the like. The foregoing materials may be used solely or may be combined at the time of use.

The styrene-type polymer in the foregoing state is a polymer obtained by using one or more polymers of styrene and styrene derivatives. It is exemplified by styrene homopolymer, styrene-butadiene copolymer, styrene-acrylnitril copolymer, and styrene-butadiene-acrylnitril copolymer.

As an alternative to using the styrene-type polymer as a thermoplastic resin, acrylic-type polymer may be employed to realize the excellent compatibility required to obtain the desired beneficial effect. The acrylic-type polymer is exemplified by a polymer obtained by using one or more materials selected from a group consisting of acrylic acid, acrylic ester, their derivatives (methacrylic acid and methacrylic ester included) and a copolymer obtaining by main using the foregoing monomer. It is exemplified by polymers such as acrylic ester homopolymer, acrylic ester copolymer, acrylic acid-acrylic ester copolymer, methacrylic ester homopolymer, methacrylic ester copolymer, methacrylic acid-methacrylic ester copolymer, methacrylic acid-acrylic ester copolymer, acrylic acid-methacrylic ester copolymer, methacrylic acid-acrylic ester copolymer, methacrylic acid-acrylic acid-methacrylic ester copolymer, and methacrylic acid-acrylic acid-methacrylic ester-acrylic acid ester copolymer.

As an alternative to using the styrene-type polymer as a thermoplastic resin, styrene-acryl-type polymer may be employed to realize the excellent compatibility required to obtain the desired beneficial effect. The styrene-acryl-type polymer is a copolymer using one or more materials selected from acrylic acid, acrylic ester and their derivatives, or a copolymer mainly using the foregoing monomer. It is exemplified by styrene-acrylic ester copolymer, styrene-acrylic acid-acrylic ester copolymer, styrene-methacrylic ester copolymer, styrene-methacrylic acid-methacrylic ester copolymer, styrene-methacrylic acid-acrylic ester copolymer, styrene-acrylic acid-methacrylic ester copolymer, styrene-methacrylic acid-acrylic acid-acrylic ester copolymer, styrene-methacrylic acid-acrylic acid-methacrylic ester copolymer, and styrene-methacrylic acid-acrylic acid-methacrylic ester-acrylic ester copolymer.

The foregoing acrylic ester is exemplified by a monomer such as methyl acrylate, ethyl acrylate, propyl acrylate, butyl acrylate, octyl acrylate, dodecyl acrylate and hexadecyl acrylate. The derivatives of the acrylic ester are exemplified by a monomer such as acrylic acid dihydroperfluorobutyl and a monomer obtained by introducing a substituent into the foregoing monomer.

The methacrylic ester is exemplified by a monomer such as methyl methacrylate, ethyl methacrylate, propyl methacrylate, isopropyl methacrylate, butyl methacrylate, sec-butyl methacrylate, tert-butyl methacrylate, isobutyl methacrylate, aryl methacrylate, phenyl methacrylate and benzyl methacrylate. The derivative of the methacrylic ester is exemplified by a monomer obtained by introducing a substituent into the monomer.

For using the hardening resin and the thermoplastic resin together, a method for dissolving the thermoplastic resin in the hardening resin may be employed. For example, a method may be employed in which the thermoplastic resin is directly dissolved into the hardening resin while stirring the thermoplastic resin or both of the foregoing resins may be dissolved in an organic solvent such as toluene, alcohol, ketone, or ester.

The light transmissive particles for use in the present invention may be polymeric particles of polyester resin, phenol resin, acrylic resin, styrene resin, epoxy resin, urethane resin, melamine resin, silicon resin, their derivatives or their copolymers; metal oxide particles of titanium oxide, silicon oxide, zinc oxide, tin oxide or aluminum oxide; carbonate particles such as lithium carbonate, calcium carbonate, strontium carbonate, barium carbonate or aluminum carbonate; glass-type particles of glass or quartz; and elastic rubber particles of urethane rubber, ethylene propylene rubber, fluorine-type rubber or silicone rubber. However, the present invention is not limited to those described above.

The foregoing particles have light transmissivity. The light transmissivity may be determined depending upon the difference in the refractive index between the hardening resin, the thermoplastic resin, and the particles. It is not defined by the optical characteristics of the particles. That is, the light transmissivity of the particles may be at a level which does not deteriorate the characteristics of the solar cell covered with the sealing film formed by the resin composition composed of the hardening resin, thermoplastic resin, and light transmissive particles. It is preferable that the particles have a light transmissivity such that a total diffused transmissivity of 85% is realized except for the optical loss due reflection of the surface of the sealing film, and more preferably the total diffused transmissivity is 93% or more.

The shape of the light transmissive particles is not particularly limited in the present invention. However, in order to reduce the optical loss and to facilitate dispersion of the particles, it is preferable that the particles be in the form of spheres, sphere-like shapes each having a smooth surface but having slight projections and pits, ellipses, or ellipse-like shapes each having a smooth surface but having slight projections and pits. If the particles are of any of the foregoing shapes, it is preferable that the average particle size of the particles be about 0.01 to 100 um.

If very hard particles such as glass beads or quartz beads are used as the light transmissive particles, an advantage can be obtained in that the excellent hardness of the foregoing materials is transmitted to the sealing material.

If titanium oxide, silicon oxide, zinc oxide, tin oxide, or aluminum oxide is used as the light transmissive particles, bonding is established between the particles and the resin. As a result, a 3-D structure can be developed, causing other advantages to be obtained in that the strength is increased, the heat resistance is improved, and the tensile strength is improved.

If particles made of elastic rubber, for example, urethane rubber-particles, ethylene propylene rubber particles, fluorine-type rubber particles, or silicone rubber particles are employed as the light transmissive particles, other advantages can be obtained in that the flexibility is improved and the tensile strength is improved.

Ultra-fine particles of sub-micron size or finer may be used as the light transmissive particles. When such ultra-fine particles are used, it is possible to effectively filter out light rays of short wavelengths less than 400 nm, so as to diminish photodegradation of the sealing material, thus advantageously improving weather resistance.

In the present invention, the proportion of the contents of the hardening resin and the thermoplastic resin is 1.5 times or more of the quantity of oil absorbed by the light transmissive particles. The quantity of the absorbed oil was measured while conforming to JIS K5101. As described above, the present invention has a large quantity of resin with respect to the oil absorbed in the particles. Therefore, the spaces between the particles are sufficiently filled with the resin and, accordingly, an excellent effect can be obtained.

The method of forming the resin composition according to the present invention on the photoelectric conversion surface or the non-photoelectric conversion surface of the solar cell may be performed in such a manner that the solar cell is dipped in a resin composition fluid or its solution, removing the solar cell, and then hardening the resin composition by using a hardening energy such as heat, light, or electron beam applied to the same. As an alternative to this, a coating method may be employed, for example, roller coating, spray coating, and electrostatic painting.

As the hardening means, a polymerization initiator such alkylperoxy ester, dialkylperoxide, peroxyketal or peroxydicarbonate, and/or a photopolymerization initiator may be used while heating, applying light, or electron beam to it. If necessary, a so-called reactive monomer serving as a polymerization initiator, for example, hexamethylene acrylate, trimethylol propane triacrylate, may be added.

In the case where a hardening resin having a polymerizable and unsaturated acrylic group having reactivity and a low molecular weight and a styrene-type polymer, acrylic-type polymer, or styrene-acrylic type polymer (the thermoplastic resin) having a number average molecular weight larger than the number average molecular weight of the hardening resin and soluble in the hardening resin are used as the resins, an excellent effect can be obtained in that the polymerization initiator does not need to be used or the quantity of the same can be significantly reduced. As a result, problems caused by use of the polymerization initiator can be overcome or reduced. That is, the following effects are obtained: excellent light transmissivity can be obtained, yellowing due to light can be reduced, and deterioration in the mechanical, optical, and physical properties such as loss of strength and devitrification can be prevented. Therefore, the foregoing materials are optimum for forming a resin for sealing a solar cell which must be used stably for a long time.

In the case where the resin composition according to the present invention seals the solar cell, the necessity of making the resin compositions formed on the photoelectric conversion surface of the solar cell and on the non-photoelectric conversion surface to be the same may be eliminated. The compositions may be different from each other in order to adapt to the shape and the purpose of the solar cell. A multi-layer sealing structure may be employed in which glass, ethylene-tetrafluoroethylene film, or a metal plate (a back support plate) or the like is stacked on the sealing resin according to the present invention. A multi-layer sealing structure in which another resin layer is formed between the solar cell and the sealing resin may be employed. Specifically, a structure may be employed in which a glass or resin thin film is formed on the outermost surface of each of the photoelectric conversion surface and the non-photoelectric conversion surface of the solar cell, and a protection layer made of the resin composition according to the present invention is formed in the inner layer.

Examples of the present invention will now be described:

EXAMPLE 1

Referring to FIG. 1, by diffusing gaseous $POCl_3$ into a p-type silicon wafer having a thickness of 0.2 mm, a pn-junction was formed between a p-type silicon single crystal wafer 1a and an $n^+$-type layer 1b. Aluminum was evaporated on the entire back surface of the p-layer, whereby a backside electrode 2 was formed. Silver paste having a width of 200 μm was then sintered on the n-layer at intervals of 5 mm, whereby a front surface electrode 3 was formed. As a result, a photovoltaic element 4 was formed. 50 parts of thermosetting phenol resin having a number average molecular weight of 600 and 20 parts of butyral resin having a number average molecular weight of 1200 were dissolved in 30 parts of methylketone whereby a solution having a viscosity of 70 CPS was prepared.

The photovoltaic element 4 was dipped in the foregoing solution, removed from the same, and dried at 150° C. for 30 minutes. As a result, a hard resin film having a thickness of 40 μm was formed on the entire surface. The foregoing process was performed two further times to seal the photovoltaic element 4 with a hard resin film 5 having a total thickness of 120 μm. As a result, a sealed solar cell 6 as shown in FIG. 1 was manufactured.

COMPARATIVE EXAMPLE 1

By employing a similar process to that according to Example 1, a solar cell sealed with only a thermosetting phenol resin film having a total thickness of 120 μm was manufactured.

Comparative Example 2

By employing a similar process to that according to Example 1, a solar cell sealed with only a butyral resin film having a total thickness of 120 μm was manufactured.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown on Table 1.

TABLE 1

| | Example 1 | Comparative Example 1 | Comparative Example 2 |
|---|---|---|---|
| Characteristics of solar cell | | | |
| Initial conversion efficiency | 13% | 12.5% | 13% |
| Conversion efficiency after 1000 hours had passed with sunshine weather meter | 11.8% | 8.0% | 10% |
| Initial characteristics of sealing material | | | |
| Surface hardness | 4 H | 4 H | H |
| Total light transmissivity | 90% | 86% | 90% |
| Adhesion (cross hatching test) | 100/100 | 100/100 | 100/100 |
| Characteristics of sealing material after 1000 hours had passed with sunshine weather meter | | | |
| Surface hardness | 4 H | 2 H | B |
| Total light transmissivity | 82% | 55% | 69% |
| Adhesion (cross hatching test) | 100/100 | 50/100 | 100/100 |

EXAMPLE 2

Figure 2:
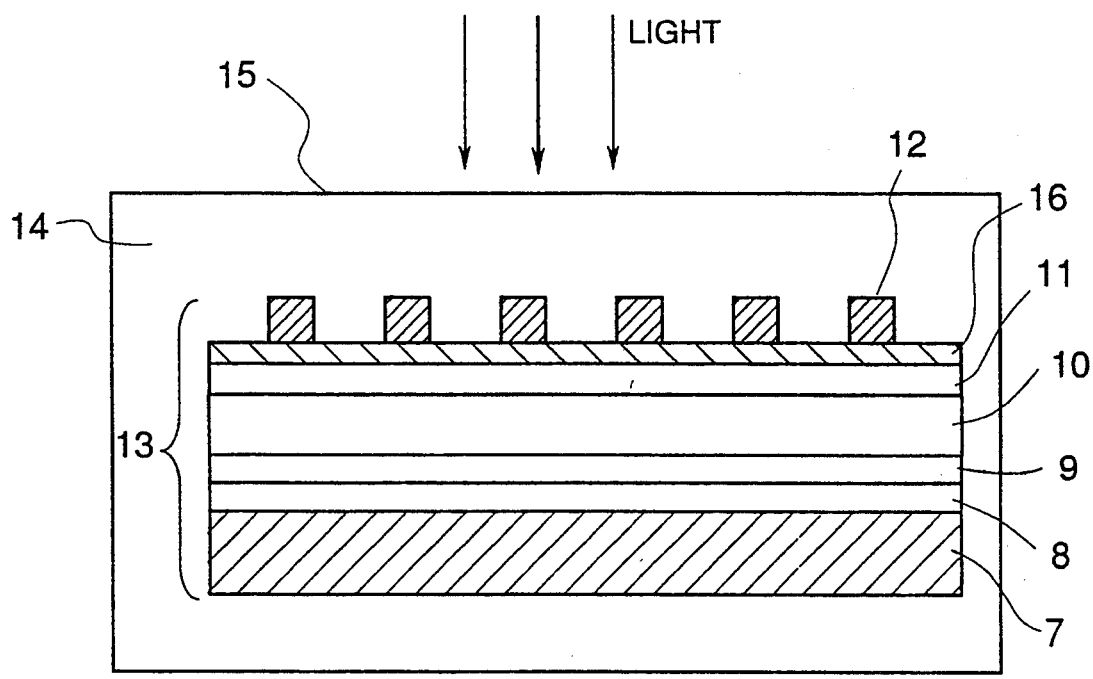
FIG. 2 is a schematic cross sectional view which illustrates another example of an amorphous solar cell which uses a sealing material according to the present invention.

Referring to FIG. 2, a Cr layer 8 having a thickness of 2000 Å was deposited on a SUS 430 substrate 7 having a thickness of 1 mm by a DC sputtering method. Then, an n-type semiconductor 9 having a thickness of 500 Å was, by an RF plasma CVD method, formed under conditions such that the ratio of $SiH_4$ gas/$PH_3$ gas was 99.98/0.02, the pressure was 1 Torr, and the RF power was 100 W. Then, an i-type semiconductor 10 having a thickness of 5000 Å was deposited under conditions such that the ratio of $SiH_4$ gas/$H_2$ gas was 30/70, the pressure was 1.5 Torr, and the RF power was 50 W. Then, a p-type semiconductor 11 having a thickness of 200 Å was deposited under conditions such that the ratios of $SiH_4$ gas/$H_2$ gas/$BF_3$ gas were 3/96.7/0.3, the pressure was 1.2 Torr, and the RF power was 1 KW. As a result of the above sequential depositions, a semiconductor layer having a pin junction was formed. Then, In was evaporated on the surface of the p-type layer 11 under an $O_2$ gas pressure of 0.5 Torr, so that a transparent conductive film 16 having a thickness of 700 Å was formed. Silver paste having a width of 200 μm was then formed at intervals of 5 mm, whereby a collecting electrode 12 was formed to complete an amorphous silicon photovoltaic element 13.

10 parts of thermosetting melamine resin having a number average molecular weight of 300, 20 parts of thermoplastic acrylic resin having a number average molecular weight of 3000, and 30 parts of polyvinyl alcohol resin having a number average molecular weight of 8000 were dissolved in 40 parts of water whereby a solution having a viscosity of 200 CPS was prepared.

The amorphous silicon photovoltaic element 13 was dipped in the foregoing solution, removed from the same, and dried at 180° C. for 30 minutes. As a result, a hard resin film having a thickness of 30 μm was formed on the entire surface.

The foregoing process was performed two further times to seal the amorphous silicon photovoltaic element 13 with a hard resin film 14 having a total thickness of 90 μm. As a result, a solar cell 15 shown in FIG. 2 was manufactured.

Comparative Example 3

A photovoltaic element 13 as used in Example 2 was sealed by a thermosetting film having a total thickness of 90 μm composed of only 10 parts of the thermosetting melamine resin according to Example 2 and 20 parts of thermoplastic acrylic resin.

Comparative Example 4

The photovoltaic element 13 as used in Example 2 was sealed by a resin film having a total thickness of 90 μm composed of only the polyvinyl alcohol resin according to Example 2.

By subjecting the solar cells thus manufactured to a sunshine weather meter, the photoelectric conversion characteristics and characteristics of the sealing material were evaluated in such a manner that the initial characteristics and those realized after 1000 hours had passed were subjected to a comparison. The results are shown in Table 2.

TABLE 2

|  | Example 2 | Comparative Example 3 | Comparative Example 4 |
| --- | --- | --- | --- |
| Characteristics of solar cell |  |  |  |
| Initial conversion efficiency | 6% | 6% | 6% |
| Conversion efficiency after 1000 hours had passed with sunshine weather meter | 5% | 3.9% | 4.5% |
| Initial characteristics of sealing material |  |  |  |
| Surface hardness | 4 H | 4 H | B |
| Total light transmissivity | 90% | 90% | 90% |
| Adhesion (cross hatching test) | 100/100 | 80/100 | 80/100 |
| Characteristics of sealing material after 1000 hours had passed with sunshine weather meter |  |  |  |
| Surface hardness | 4 H | 2 H | 2 B |
| Total light transmissivity | 75% | 58% | 67% |
| Adhesion (cross hatching test) | 100/100 | 60/100 | 50/100 |
| Adhesion after allowing to stand at 50° C. and 100% RH for 500 hours | 100/100 | 30/100 | 10/100 |

EXAMPLE 3

20 parts of thermosetting polyester resin having a number average molecular weight of 2000, one part of di-t-butylperoxide, and 20 parts of polycarbonate resin having a number average molecular weight of 10000 were dissolved in 50 parts of dichloromethane whereby a solution having a viscosity of 100 CPS was prepared.

A photovoltaic element according to Example 2 was dipped in the foregoing solution, removed from the same, and dried at 180° C. for 30 minutes. As a result, a hard resin film having a thickness of 25 μm was formed on the entire surface.

The foregoing process was performed two further times to seal the photovoltaic element with a hard resin film having a total thickness of 75 μm, whereby a solar cell was manufactured.

Comparative Example 5

A solution composed of 58 parts of the thermosetting polyester resin according to Example 3, two parts of di-t-butylperoxide, and 40 parts of dichloromethane was applied three times, followed by heating and drying so that a photovoltaic element according to Example 2 was sealed with a hard resin film having a total thickness of 75 μm, whereby an experimental solar cell was manufactured.

Comparative Example 6

A photovoltaic element according to Example 2 was repeatedly applied with a solution in which the polycarbonate resin according to Example 3 was dissolved in dichloromethane, followed by drying, whereby an experimental solar cell sealed with a resin film having a total thickness of 75 μm was manufactured.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 3.

TABLE 3

|  | Example 3 | Comparative Example 5 | Comparative Example 6 |
| --- | --- | --- | --- |
| Characteristics of solar cell | | | |
| Initial conversion efficiency | 6% | 6% | 6% |
| Conversion efficiency after 1000 hours had passed with sunshine weather meter | 5% | 3.7% | 4.3% |
| Initial characteristics of sealing material | | | |
| Surface hardness | 6 H | 6 H | 2 H |
| Total light transmissivity | 90% | 90% | 90% |
| Adhesion (cross hatching test) | 100/100 | 70/100 | 50/100 |
| Characteristics of sealing material after 1000 hours had passed with sunshine weather meter | | | |
| Surface hardness | 6 H | 3 H | HB |
| Total light transmissivity | 75% | 56% | 65% |
| Adhesion (cross hatching test) | 100/100 | 40/100 | 30/100 |
| Adhesion after allowing to stand at 50° C. and 100% RH for 500 hours | 100/100 | 40/100 | 30/100 |

As can be clearly seen from the results shown in Tables 1 to 3, solar cells according to the present invention exhibit excellent photoelectrical conversion characteristics. Further, the initial excellent conversion efficiency can be maintained even after the sunshine weather meter test simulating actual use was conducted.

EXAMPLE 4

By diffusing gaseous $POCl_3$ into a p-type silicon wafer having a thickness of 0.2 mm, a pn junction was formed between a p-type silicon single crystal 1a and an n+-type layer 1b. Aluminum was then evaporated on the entire back surface of the p-layer, whereby a backside electrode 2 was formed. Silver paste having a width of 200 μm was then sintered on the n-layer at intervals of 5 mm, whereby a front surface electrode 3 was formed. As a result, a photovoltaic element 4 as shown in FIG. 1 was formed.

50 parts of acrylate ester oligomer having a number average molecular weight of 400 and 20 parts of styrene resin composed of styrene monomer having a number average molecular weight of 15,000 were dissolved in 30 parts of methylethylketone so that a solution having a viscosity of 100 CPS was prepared.

The photovoltaic element 4 was dipped in the foregoing solution, removed from the same, and dried at 100° C. for 20 minutes. Then, it was irradiated, for 30 seconds, with light of 365 nm and an illuminance of 50 mW/cm² emitted from a high voltage mercury lamp. As a result, a hard resin film having a thickness of 40 μm was formed on the entire surface. The foregoing process was performed two further times to seal the photovoltaic element 4 with a hard resin film 5 having a total thickness of 120 μm. As a result, a sealed solar cell 6 similar to that shown in FIG. 1 was manufactured.

Comparative Example 7

50 parts of unsaturated polyester having a number average molecular weight of 1000, two parts of dicumyl peroxide and 20 parts of the styrene resin according to Example 4 were dissolved in 28 parts of methylethylketone, so that a solution having a viscosity of 90 CPS was prepared.

The photovoltaic element 4 was dipped in the foregoing solution, removed from the same, and dried at 150° C. for 30 minutes. As a result, a hard resin film having a thickness of 40 μm was formed on the entire surface. The foregoing process was performed two further times, whereby a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 4.

TABLE 4

|  | Example 4 | Comparative Example 7 |
| --- | --- | --- |
| Characteristics of solar cell | | |
| Initial conversion efficiency | 13.3% | 12.5% |
| Conversion efficiency after 1000 hours had passed with sunshine weather meter | 12.0% | 10.5% |
| Initial characteristics of sealing material | | |
| Surface hardness | 4 H | 3 H |
| Total light transmissivity | 93% | 89% |
| Adhesion (cross hatching test) | 100/100 | 100/100 |
| Characteristics of sealing material after 1000 hours had passed with sunshine weather-meter | | |
| Surface hardness | 4 H | 2 H |
| Total light transmissivity | 86% | 75% |
| Adhesion (cross hatching test) | 100/100 | 85/100 |

EXAMPLE 5

A Cr layer 8 having a thickness of 2000 Å was deposited on a SUS 430 substrate 7 having a thickness of 1 mm by a DC sputtering method. Then, a n-type semiconductor 9 having a thickness of 500 Å was formed under conditions such that the ratio of $SiH_4$ gas/$PH_3$ gas was 99.98/0.02, the pressure was 1 Torr, and the RF power was 100 W. Then, an i-type semiconductor 10 having a thickness of 5000 Å was deposited under conditions such that the ratios of $SiH_4$ gas/$H_2$ gas were 30/70, the pressure was 1.5 Torr, and the RF power was 50W. Then, a p-type semiconductor 11 having a thickness of 200 Å was deposited under conditions such that the ratio of $SiH_4$ gas/$H_2$ gas/$BF_3$ gas was 3/96.7/0.3, the pressure was 1.2 Torr, and the RF power was 1 KW. As a result of the above sequential depositions, a semiconductor layer having a pin junction was formed. Then, In was evaporated on the surface under an $O_2$ gas pressure of 0.5 Torr, so that a transparent conductive film 16 having a thickness of 700 Å was formed. Silver paste having a width of 200 μm was then formed at intervals of 5 mm, whereby a collecting electrode 12 was formed to complete an amorphous silicon photovoltaic element 13 as shown in FIG. 2.

50 parts of acrylate epoxy oligomer having a number average molecular weight of 600 and 20 parts of styrene resin composed of styrene-butadiene monomer having a number average molecular weight of 8000 (monomer composition 80 parts/20 parts) were dissolved in 30 parts of ethyl acetate ester whereby a solution having a viscosity of 150 CPS was prepared.

The amorphous silicon photovoltaic element 13 was dipped in the foregoing solution, removed from the same, and dried at 100° C. for 20 minutes. As a result, a hard resin film having a thickness of 40 μm was formed on the entire surface. The foregoing process was performed two further times to seal the amorphous silicon photovoltaic element 13 with a hard resin film 14 having a total thickness of 120 μm. As a result, a sealed solar cell 15 similar to that shown in FIG. 2 was manufactured.

Comparative Example 8

50 parts of thermosetting phenol resin having a number average molecular weight of 600 and 20 parts of the acrylic resin according to Example 2 were dissolved in 30 parts of methylethylketone so that a solution having a viscosity of 80 CPS was prepared.

A photovoltaic element as used in Example 5 was dipped in the foregoing solution and removed from the same. Then, it was dried at 150° C. for 30 minutes, whereby a hard resin film having a thickness of 40 μm was formed on the entire surface. The foregoing process was repeated two further times so that a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 5.

TABLE 5

|  | Example 5 | Comparative Example 8 |
| --- | --- | --- |
| Characteristics of solar cell |  |  |
| Initial conversion efficiency | 6.2% | 5.6% |
| Conversion efficiency after 1000 hours had passed with sunshine weather meter | 5.4% | 4.4% |
| Initial characteristics of sealing material |  |  |
| Surface hardness | 3 H | 3 H |
| Total light transmissivity | 92% | 85% |
| Adhesion (cross hatching test) | 100/100 | 90/100 |
| Characteristics of sealing material after 1000 hours had passed with sunshine weather meter |  |  |
| Surface hardiless | 3 H | H |
| Total light transmissivity | 85% | 70% |
| Adhesion (cross hatching test) | 100/100 | 60/100 |
| Adhesion after allowing to stand at 50° C. and 100% RH for 500 hours | 100/100 | 65/100 |

EXAMPLE 6

50 parts of acrylate urethane oligomer having a number average molecular weight of 200 and 15 parts of styrene resin composed of styrene monomer having a number average molecular weight of 20000 were dissolved in 35 parts of toluene, whereby a solution having a viscosity of 250 CPS was prepared.

A photovoltaic element according to Example 5 was dipped in the foregoing solution, removed from the same and dried at 100° C. for 20 minutes. Then, it was irradiated for 30 seconds with light of 365 nm and an illuminance of 50 mW/cm² emitted from a high voltage mercury lamp. As a result, a resin composition film having a thickness of 40 μm was formed on the entire surface.

The foregoing process was performed two further times to seal the photovoltaic element with the resin composition film having a total thickness of 120 μm, so that a solar cell similar to that shown in FIG. 2 was manufactured.

Comparative Example 9

50 parts of diaryl phthalate resin having a number average molecular weight of 1000, two parts of di-t-butylperoxide, and 15 parts of the styrene resin according to Example 5 were dissolved in 35 parts of toluene, so that a solution having a viscosity of 180 CPS was prepared.

A photovoltaic element according to Example 5 was dipped in the foregoing resolution, removed from the same, and dried at 150° C. for 30 minutes. As a result, a hard resin film having a thickness of 40 μm was formed on the entire surface. The foregoing process was performed two further times, so that a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 6.

TABLE 6

|  | Example 6 | Comparative Example 9 |
| --- | --- | --- |
| Characteristics of solar cell |  |  |
| Initial conversion efficiency | 6.2% | 5.3% |
| Conversion efficiency after 1000 hours had passed with sunshine weather meter | 5.4% | 4.4% |
| Initial characteristics of sealing material |  |  |
| Surface hardness | 6 H | 6 H |
| Total light transmissivity | 93% | 80% |
| Adhesion (cross hatching test) | 100/100 | 70/100 |
| Characteristics of sealing material after 1000 hours had passed with sunshine weather meter |  |  |
| Surface hardness | 5 H | 2 H |
| Total light transmissivity | 86% | 69% |
| Adhesion (cross hatching test) | 100/100 | 40/100 |
| Adhesion after allowing to stand at 50° C. and 100% RH for 500 hours | 100/100 | 40/100 |

As can be clearly seen from the results shown in Tables 4 to 6, the solar cells according to the present invention exhibit excellent photoelectrical conversion characteristics. Further, the initial excellent conversion efficiency can be maintained even after a sunshine weather meter test simulating actual use was conducted.

EXAMPLE 7

By diffusing gaseous $POCl_3$ into a p-type silicon wafer having a thickness of 0.2 mm, a pn junction was formed between a p-type silicon single crystal 1a and an n+layer 1b. Aluminum was then evaporated on the entire back surface of the p-layer, whereby a backside electrode 2 was formed. Silver paste having a width of 200 μm was then sintered on the n-layer at intervals of 5 mm, whereby a front surface electrode 3 was formed. As a result, a photovoltaic element 4 as shown in FIG. 1 was formed.

50 parts of acrylate ester oligomer having a number average molecular weight of 400 and 20 parts of acrylic resin composed of a monomer of methyl methacrylate ester-butyl methacrylate ester-acrylic acid (monomer composition 30 parts/60 parts/10 parts) were dissolved in 30 parts methylethylketone so that a solution having a viscosity of 100 CPS were prepared.

The photovoltaic element 4 was dipped in the foregoing solution, removed from the same, and dried at 100° C. for 20 minutes. Then, it was irradiated for 30 seconds with light of 365 nm and an illuminance of 50 mW/cm² emitted from a high voltage mercury lamp. As a result, a hard resin film having a thickness of 40 μm was formed on the entire surface. The foregoing process was performed two further times to seal the photovoltaic element 4 with a hard resin film 5 having a total thickness of 120 μm. As a result, a sealed solar cell 6 similar to that shown in FIG. 1 was manufactured.

Comparative Example 10

50 parts of unsaturated polyester having a number average molecular weight of 1000, two parts of dicumyl peroxide and 20 parts of the acrylic resin according to Example 7 were dissolved in 28 parts of methylethylketone, so that a solution having a viscosity of 90 CPS were prepared.

A photovoltaic element 4 according to Example 7 was dipped in the foregoing solution, removed from the same, and dried at 150° C. for 30 minutes. As a result, a hard resin film 5 having a thickness of 40 μm was formed on the entire surface. The foregoing process was performed two further times, so that a hard resin film 5 having a total thickness of 120 μm was formed.

By subjecting the solar cell 6 thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 7.

TABLE 7

| | Example 7 | Comparative Example 10 |
|---|---|---|
| Characteristics of solar cell | | |
| Initial conversion efficiency | 13% | 12.5% |
| Conversion efficiency after 1000 hours had passed with sunshine weather meter | 12.3% | 11% |
| Initial characteristics of sealing material | | |
| Surface hardness | 5 H | 4 H |
| Total light transmissivity | 93% | 89% |
| Adhesion (cross hatching test) | 100/100 | 100/100 |
| Characteristics of sealing material after 1000 hours had passed with sunshine weather meter | | |
| Surface hardness | 5 H | 3 H |
| Total light transmissivity | 88% | 78% |
| Adhesion (cross hatching test) | 100/100 | 85/100 |

EXAMPLE 8

A Cr layer 8 having a thickness of 2000 Å was deposited on a SUS 430 substrate 7 having a thickness of 1 mm by a DC sputtering method. Then, an n-type semiconductor 9 having a thickness of 500 Å was, by an RF plasma CVD method, formed under conditions such that the ratio of $SiH_4$ gas/$PH_3$ gas was 99.98/0.02, the pressure was 1 Torr, and the RF power was 100 W. Then, a i-type semiconductor 10 having a thickness of 5000 Å was deposited under conditions such that the ratio of $SiH_4$ gas/$H_2$ gas was 30/70, the pressure was 1.5 Torr, and the RF power was 50 W. Then, a p-type semiconductor 11 having a thickness of 200 Å was deposited under conditions such that the ratios of $SiH_4$ gas/$H_2$ gas/$BF_3$ gas were 3/96.7/0.3, the pressure was 1.2 Torr, and the RF power was 1 KW. As a result of the above sequential depositions, a semiconductor layer having a pin junction was formed. Then, In was evaporated on the surface under an $O_2$ gas pressure of 0.5 Torr, so that a transparent conductive film 16 having a thickness of 700 Å was formed. Silver paste having a width of 200 μm was then formed at intervals of 5 mm, whereby a collecting electrode was formed to complete an amorphous silicon photovoltaic element 13 as shown in FIG. 2.

50 parts of acrylate epoxy oligomer having a number average molecular weight of 600 and 20 parts of acrylic resin composed of monomer of methylacrylate ester having a number average molecular weight of 15,000, butylmethacrylate ester and methacrylic acid (monomer composition 50 parts/35 parts/15 parts) were dissolved in 30 parts of methyl acetate ester so that a solution having a viscosity of 150 CPS was prepared.

The amorphous silicon photovoltaic element 13 was dipped in the foregoing solution, removed from the same, and dried at 100° C. for 20 minutes. Then, it was irradiated for 30 seconds with light of 365 nm and an illuminance of 50 mW/cm² emitted from a high voltage mercury lamp. As a result, a hard resin film having a thickness of 40 μm was formed on the entire surface. The foregoing process was performed two further times to seal the photovoltaic element 13 with a hard resin film 14 having a total thickness of 120 μm. As a result, a solar cell 6 similar to that shown in FIG. 2 was manufactured.

Comparative Example 11

50 parts of thermosetting phenol resin having a number average molecular weight of 600 and 20 parts of the acrylic resin according to Example 2 were dissolved in 30 parts of methylethyl ketone so that a solution having a viscosity of 100 CPS was prepared.

An amorphous silicon photovoltaic element according to Example 8 was dissolved in the foregoing solution and removed from it. Then, it was dried at 150° C. for 30 minutes, so that a hard resin film having a thickness of 40 μm was formed on the entire surface. The foregoing process was repeated two further times so that a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 8.

TABLE 8

| | Example 8 | Comparative Example 11 |
|---|---|---|
| Characteristics of solar cell | | |
| Initial conversion efficiency | 6.2% | 5.6% |
| Conversion efficiency after 1000 hours had passed with sunshine weather meter | 5.4% | 4.4% |
| Initial characteristics of sealing | | |

TABLE 8-continued

|  | Example 8 | Comparative Example 11 |
|---|---|---|
| material |  |  |
| Surface hardness | 4 H | 4 H |
| Total light transmissivity | 92% | 85% |
| Adhesion (cross hatching test) | 100/100 | 90/100 |
| Characteristics of sealing material after 1000 hours had passed with sunshine weather meter |  |  |
| Surface hardness | 4 H | 2 H |
| Total light transmissivity | 85% | 70% |
| Adhesion (cross hatching test) | 100/100 | 60/100 |
| Adhesion after allowing to stand at 50° C. and 100% RH for 500 hours | 100/100 | 65/100 |

EXAMPLE 9

50 parts of acrylate urethane oligomer having a number average molecular weight of 200 and 15 parts of acrylic resin composed of butyl methacrylate ester having a number average molecular Weight of 20,000 and methacrylic acid monomer (monomer composition 80 parts/20 parts) were dissolved in 35 parts of toluene so that a solution having a viscosity of 120 CPS was prepared.

A photovoltaic element 4 according to Example 8 was dipped in the foregoing solution, removed from the same, and dried at 100° C. for 20 minutes. Then, it was irradiated for 30 seconds with light of 365 nm and an illuminance of 50 mW/cm$^2$ emitted from a high voltage mercury lamp. As a result, a hard resin composition film having a thickness of 40 μm was formed on the entire surface. The foregoing process was performed two further times, so that the photovoltaic element with the hard resin film having a total thickness of 120 μm, so that a solar cell was manufactured.

Comparative Example 12

50 parts of diaryl phthalate resin having a number average molecular weight of 1000, two parts of di-t-butylperoxide, and 15 parts of the acrylic resin according to Example 8 were dissolved in 35 parts of toluene, so that a solution having a viscosity of 180 CPS was prepared.

A photovoltaic element according to Example 8 was dipped in the foregoing resolution, removed from the same, and dried at 150° C. for 30 minutes. As a result, a hard resin film having a thickness of 40 μm was formed on the entire surface. The foregoing process was performed two further times, so that a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 9.

TABLE 9

|  | Example 9 | Comparative Example 12 |
|---|---|---|
| Characteristics of solar cell |  |  |
| Initial conversion efficiency | 6.2% | 5.3% |
| Conversion efficiency after 1000 hours had passed with sunshine weather meter | 5.4% | 4.4% |
| Initial characteristics of sealing |  |  |

TABLE 9-continued

|  | Example 9 | Comparative Example 12 |
|---|---|---|
| material |  |  |
| Surface hardness | 6 H | 6 H |
| Total light transmissivity | 93% | 80% |
| Adhesion (cross hatching test) | 100/100 | 70/100 |
| Characteristics of sealing material after 1000 hours had passed with sunshine weather meter |  |  |
| Surface hardness | 6 H | 3 H |
| Total light transmissivity | 86% | 69% |
| Adhesion (cross hatching test) | 100/100 | 40/100 |
| Adhesion after allowing to stand at 50° C. and 100% RH for 500 hours | 100/100 | 40/100 |

As can be clearly seen from the results shown in Tables 7 to 9, the solar cells according to the present invention exhibit excellent photoelectrical conversion characteristics. Further, the initial excellent conversion efficiency can be maintained even after a sunshine weather meter test which simulates actual use was conducted.

EXAMPLE 10

By diffusing gaseous POCl$_3$ into a p-type silicon wafer having a thickness of 0.2 mm, a pn-junction was formed between a p-type silicon single crystal 1a and an n$^+$-type layer 1b. Aluminum was then evaporated on the entire back surface of the p-layer, whereby a backside electrode 2 was formed. Silver paste having a width of 200 μm was then sintered on the n-layer at intervals of 5 mm, whereby a front surface electrode 3 was formed. As a result, a photovoltaic element 4 as shown in FIG. 1 was formed.

50 parts of acrylate ester oligomer having a number average molecular weight of 400 and 20 parts of acrylic resin composed of styrene methylmethacrylate ester-butylmethacrylate ester-acrylic acid monomer (monomer composition 20 parts/30 parts/40 parts/10 parts) were dissolved in 30 parts of methylethyl ketone so that a solution having a viscosity of 100 CPS was prepared.

The photovoltaic element 4 was dipped in the foregoing solution, removed from the same, and dried at 100° C. for 20 minutes. Then, it was irradiated for 30 seconds with light of 365 nm and an illuminance of 50 mW/cm$^2$ emitted from a high voltage mercury lamp. As a result, a hard resin film having a thickness of 40 μm was formed on the entire surface. The foregoing process was performed two further times to seal the photovoltaic element 4 with a hard resin film 5 having a total thickness of 120 μm. As a result, a sealed solar cell 6 similar to that shown in FIG. 1 was manufactured.

Comparative Example 13

50 parts of unsaturated polyester having a number average molecular weight of 1000, 2 parts of dicumyl peroxide and 20 parts of the styrene resin according to Example 10 were dissolved in 28 parts of methylethylketone, so that a solution having a viscosity of 90 CPS was prepared.

A photovoltaic element 4 according to Example 10 was dipped in the foregoing solution, removed from the same, and dried at 150° C. for 30 minutes. As a result, a hard resin film having a thickness of 40 μm was formed on the entire surface. The foregoing process was performed two further times, so that a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 10.

TABLE 10

| | Example 10 | Comparative Example 13 |
|---|---|---|
| Characteristics of solar cell | | |
| Initial conversion efficiency | 13.3% | 12.5% |
| Conversion efficiency after 1000 hours had passed with sunshine weather meter | 12.6% | 11% |
| Initial characteristics of sealing material | | |
| Surface hardness | 6 H | 4 H |
| Total light transmissivity | 95% | 83% |
| Adhesion (cross hatching test) | 100/100 | 100/100 |
| Characteristics of sealing material after 1000 hours had passed with sunshine weather meter | | |
| Surface hardness | 6 H | 3 H |
| Total light transmissivity | 90% | 75% |
| Adhesion (cross hatching test) | 100/100 | 85/100 |

EXAMPLE 11

A Cr layer 8 having a thickness of 2000 Å was deposited on a SUS 430 substrate 7 having a thickness of 1 mm by a DC sputtering method. Then, an n-type semiconductor 9 having a thickness of 500 Å was, by an RF plasma CVD method, formed under conditions such that the ratio of $SiH_4$ gas/$PH_3$ gas was 99.98/0.02, the pressure was 1 Torr, and the RF power was 100 W. Then, an i-type semiconductor 10 having a thickness of 5000 Å was deposited under conditions such that the ratio of $SiH_4$ gas/$H_2$ gas was 30/70, the pressure was 1.5 Torr, and the RF power was 50 W. Then, a p-type semiconductor 11 having a thickness of 200 Å was deposited under conditions such that the ratios of $SiH_4$ gas/$H_2$ gas/$BF_3$ gas were 3/96.7/0.3, the pressure was 1.2 Torr, and the RF power was 1 KW. As a result of the above sequential depositions, a semiconductor layer having a pin junction was formed. Then, In was evaporated on the surface under an $O_2$ gas pressure of 0.5 Torr, so that a transparent conductive film 16 having a thickness of 700 Å was formed. Silver paste having a width of 200 μm was then formed at intervals of 5 mm, whereby a collecting electrode 12 was formed to complete an amorphous silicon photovoltaic element 13 as shown in FIG. 2.

50 parts of acrylate epoxy oligomer having a number average molecular weight of 600 and 20 parts of acrylic resin of methyl acrylate-butyl methacrylate-methacrylic acid (monomer composition 50 parts/35 parts/15 parts) having a number average molecular weight of 15,000 were dissolved in 30 parts of ethyl acetate ester so that a solution having viscosity of 150 CPS was prepared.

The amorphous silicon photovoltaic element 13 was dipped in the foregoing solution, removed from the same, and dried at 100° C. for 20 minutes. Then, it was irradiated for 30 seconds with light of 365 nm and an illuminance of 50 mW/cm² emitted from a high voltage mercury lamp. As a result, a hard resin film having a thickness of 40 μm was formed on the entire surface. The foregoing process was performed two further times to seal the photovoltaic element 13 with a hard resin film having a total thickness of 120 μm. As a result, a solar cell similar to that shown in FIG. 2 was manufactured.

Comparative Example 14

50 parts of thermosetting phenol resin having a number average molecular weight of 600 and 20 parts of the acrylic resin according to Example 11 were dissolved in 30 parts of methylethyl ketone so that a solution having a viscosity of 100 CPS were prepared.

A photovoltaic element 13 according to Example 11 was dipped in the foregoing solution, removed from the same, and dried at 150° C. for 30 minutes. As a result, a hard resin film having a thickness of 40 μm was formed on the entire surface. The foregoing process was performed two further times so that a hard resin film having a total thickness of 120 μm was formed.

By subjecting the solar cells thus manufactured to a sunshine weather meter, the photoelectric conversion characteristics-and the characteristics of the sealing material were evaluated in such a manner that the initial characteristics and those realized after 1000 hours had passed were subjected to a comparison. The results are shown in Table 11.

TABLE 11

| | Example 11 | Comparative Example 14 |
|---|---|---|
| Characteristics of solar cell | | |
| Initial conversion efficiency | 6.3% | 5.6% |
| Conversion efficiency after 1000 hours had passed with sunshine weather meter | 5.7% | 4.4% |
| Initial characteristics of sealing material | | |
| Surface hardness | 5 H | 4 H |
| Total light transmissivity | 94% | 85% |
| Adhesion (cross hatching test) | 100/100 | 90/100 |
| Characteristics of sealing material after 1000 hours had passed with sunshine weather meter | | |
| Surface hardness | 5 H | 2 H |
| Total light transmissivity | 89% | 70% |
| Adhesion (cross hatching test) | 100/100 | 60/100 |
| Adhesion after allowing to stand at 50° C. and 100% RH for 500 hours | 100/100 | 65/100 |

EXAMPLE 12

50 parts of acrylate urethane oligomer having a number average molecular weight of 200 and 15 parts of acrylic resin composed of styrene ethyl acrylate ester having a number average molecular weight of 20,000 and butyl methacrylate butyl ester and methacrylic monomer (monomer composition 30 parts/30 parts/20 parts/20 parts) were dissolved in 35 parts of toluene, so that a solution having a viscosity of 180 CPS was prepared.

A photovoltaic element according to Example 11 was dipped in the foregoing solution, removed from the same, and dried at 100° C. for 20 minutes. Then, it was irradiated for 30 seconds with light of 365 nm and an illuminance of 50 mW/cm² emitted from a high voltage mercury lamp. As a result, a hard resin film having a thickness of 40 μm was formed on the entire surface. The foregoing process was performed two further times to seal the photovoltaic element with a hard resin film having a total thickness of 120 μm. As a result, a solar cell was manufactured.

Comparative Example 15

50 parts of diarylphthalate resin having a number average molecular weight of 1000, two parts of di-t-butylperoxide, and 15 parts of acrylic resin according to Example 11 were dissolved in 35 parts of toluene so that a solution having a viscosity of 180 CPS was prepared.

A photovoltaic element according to Example 11 was dipped in the foregoing resolution, removed from the same, and dried at 150° C. for 30 minutes. As a result, a hard resin film having a thickness of 40 μm was formed on the entire surface. The foregoing process was performed two further times, so that a hard resin film having a total thickness of 120 μm was formed.

By subjecting the solar cells thus manufactured to a sunshine weather meter, the photoelectric conversion characteristics and the characteristics of the sealing material were evaluated in such a manner that the initial characteristics and those realized after 1000 hours had passed were subjected to a comparison. The results are shown in Table 12.

TABLE 12

|  | Example 12 | Comparative Example 15 |
|---|---|---|
| Characteristics of solar cell | | |
| Initial conversion efficiency | 6.3% | 5.3% |
| Conversion efficiency after 1000 hours had passed with sunshine weather meter | 5.7% | 4.4% |
| Initial characteristics of sealing material | | |
| Surface hardness | 6 H | 6 H |
| Total light transmissivity | 93% | 80% |
| Adhesion (cross hatching test) | 100/100 | 70/100 |
| Characteristics of sealing material after 1000 hours had passed with sunshine weather meter | | |
| Surface hardness | 6 H | 3 H |
| Total light transmissivity | 88% | 69% |
| Adhesion (cross hatching test) | 100/100 | 40/100 |
| Adhesion after allowing to stand at 50° C. and 100% RH for 500 hours | 100/100 | 40/100 |

As can be clearly seen from the results shown in Tables 10 to 12, the solar cells according to the present invention exhibit excellent photoelectrical conversion characteristics. Further, the initial excellent conversion efficiency can be maintained even after a sunshine weather meter test which simulates actual use was conducted.

EXAMPLE 13

Figure 3:
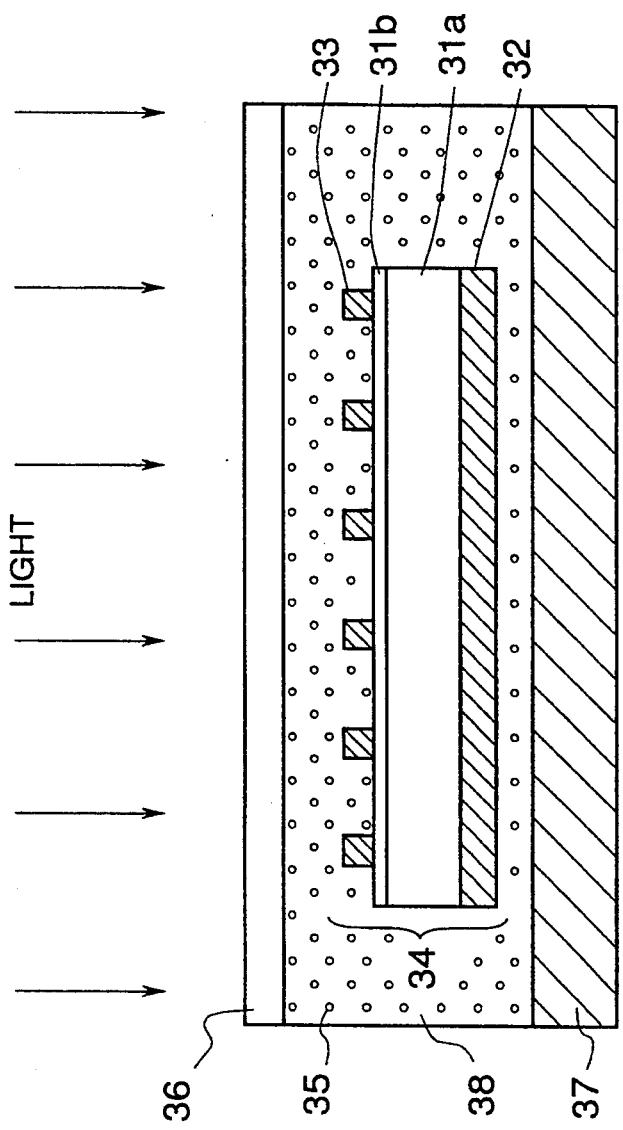
FIG. 3 is a schematic cross sectional view which illustrates another example of a solar cell which uses a sealing material according to the present invention.

Gaseous $POCl_3$ was diffused into a p-type silicon single crystal wafer having a thickness of 0.2 mm so that a pn-junction (between p-layer 31a and n-layer 31b) was formed. Then, aluminum was evaporated on the entire back surface of the p-layer 31a whereby a backside electrode 32 was formed. Silver paste having a width of 200 μm was then sintered on the n-layer 31b at intervals of 5 mm whereby a front surface electrode 33 was formed. As a result, a photovoltaic element 34 schematically shown in FIG. 3 was formed. 100 parts by weight of ethylene-vinyl acetate copolymer serving as the thermoplastic resin and 100 parts by weight of spherical, light transmissive glass beads 35, the oil absorption quantity of which was 12 g/100 g, the average particle size of which was 100 μm were uniformly mixed at 100° C. whereby a resin composition was obtained.

The foregoing resin composition was melted and applied to one side of an ethylene-tetrafluoroethylene copolymer film 36 having a thickness of 25 μm so that a resin composition layer having a thickness of 150 μm was formed. The foregoing resin composition was melted and applied to one side of a stainless steel sheet 37 having a thickness of 0.3 mm so that a resin composition layer having a thickness of 150 μm was formed.

The photovoltaic element 34 was then placed between the two foregoing laminates such that the ethylene-tetrafluoroethylene copolymer film 36 having the resin composition thereon faced toward the n-layer 31b, which was the photoelectric conversion side of the photovoltaic element 34. Further, the stainless steel sheet 37 was so disposed that the resin composition layer faced the backside electrode 32. Then, a vacuum laminating machine was used to heat it at 150° C. for one hour so that a sealing layer 38 was formed by integrating the resin composition layer of the stainless steel sheet 37. As a result, a solar cell schematically shown in FIG. 3 and sealed by the resin composition was obtained.

Comparative Example 16

The glass beads serving as the light transmissive particles according to Example 13 were not used but only resin was used to seal the solar cell by a similar procedure.

The conversion efficiency and the surface hardness of the solar cells according to Example 13 and Comparative Example 16 were evaluated. The results are shown in Table 13. As shown in Table 13, no output was obtained from the solar cell according to Comparative Example 16. The reason for this is that the thickness of the sealing material in the peripheral edge portion of the photovoltaic element was too thin, causing an electric short-circuit to occur with the back side stainless steel sheet 37. As for the damage resistance, the sample according to Example 13 was free from damage but the sample according to Comparative Example 16 was damaged.

EXAMPLE 14

Chromium was, by a DC sputtering method, deposited on a SUS 430 stainless steel substrate 409 having a thickness of 1 mm whereby a layer 410 having a thickness of 2000 Å was formed. Then, an RF plasma CVD method was employed to form a 500 Å thick n-type semiconductor layer 411 under conditions such that the ratio of $SiH_4$ gas/$PH_3$ gas was 99.98/0.02, the pressure was 1 Torr, and the RF power was 100 W.

Then, an i-type semiconductor layer 412 having a thickness of 5000 Å was formed under conditions such that the ratio of $SiH_4$ gas/$H_2$ gas was 30/70, the pressure was 1.5 Torr, and the RF power was 50 W.

Then, a p-type semiconductor layer 413 having a thickness of 200 Å was formed under conditions such that the ratios of $SiH_4$ gas/$H_2$ gas/$BF_3$ gas were 3/96.7/0.3, the pressure was 1.2 Torr, and the RF power was 1 KW. As a result, a semiconductor layer having a pin junction was formed.

Figure 4:
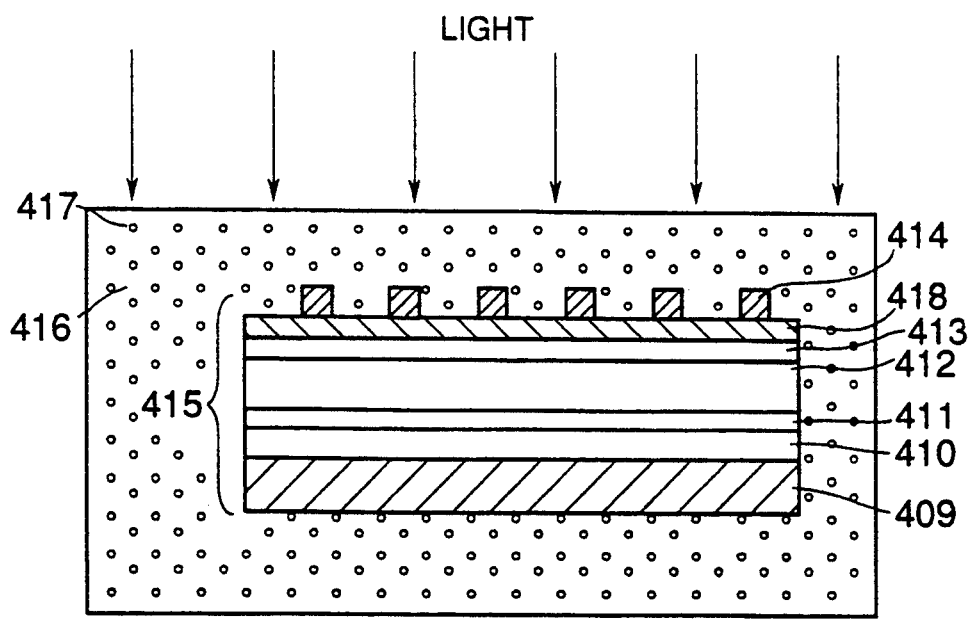
FIG. 4 is a schematic cross sectional view which illustrates another example of a solar cell which uses a sealing material according to the present invention.

Then, In was evaporated on the surface under an $O_2$ gas pressure of 0.5 Torr, whereby a transparent conductive film 18 having a thickness of 700 Å and made of indium oxide was formed. Silver paste having a width of 200 μm was used at intervals of 5 mm, so that a front side electrode 414 was formed. Thus, a photovoltaic element 415 schematically shown in FIG. 4 was formed.

100 parts by weight of polyvinyl butyral resin serving as the thermoplastic resin and 30 parts by weight of spherical titanium oxide particles, the quantity of oil absorption of which was 30 g/100 g, the average particle size of which was 0.017 μm and which served as light transmissive particles 417 were uniformly dissolved and dispersed in 500 parts by weight of methylethyl ketone whereby a dispersed solution of the resin composition was obtained.

The photovoltaic element 415 was dipped in the foregoing dispersed solution, removed from the same and dried at 150° C. for one hour. As a result, a solar cell having a sealing film 416 of a thickness of 50 μm and formed on the entire photoelectric conversion surface and the backside thereof and schematically shown in FIG. 4 was obtained.

Comparative Example 17

The titanium oxide particles serving as the light transmissive particles according to Example 14 were not used but sealing was performed using only the resin by a similar method to that according to Example 14.

The conversion efficiency and the surface hardness of the solar cells according to Example 14 and Comparative Example 17 were evaluated. The results are shown in Table 13. As shown in Table 13, the sample according to Example 14 did not suffer a reduction in conversion efficiency due to the weathering test in comparison to Comparative Example 17. The main reason for this is that the ultraviolet ray absorption property of the titanium oxide particles contained in the sample according to Example 14 prevents the photodeterioration of the polyvinyl butyral resin. Therefore, deterioration in the light transmissivity is prevented. Further, the titanium oxide particles harden the sealing material so that the damage resistance was significantly improved. Superior high temperature and high humidity resistance to that obtainable from Comparative Example 17 was attained from Example 14. The reason for this is that the uniformity of the sealing film was significantly improved according to Example 14. Therefore, the film thickness reduction in the peripheral portion of the photovoltaic element and in the portion overlying the front surface electrode can be prevented. As a result, the excessive deterioration in the conversion efficiency was prevented.

EXAMPLE 15

100 parts by weight of thermosetting phenol resin and 65 parts by weight of urethane rubber particles, the oil absorption quantity of which was 50 g/100 g, the average particle size of which was 50 μm and which were light transmissive, were uniformly dissolved and dispersed in 100 parts by weight of methylethyl ketone, whereby a dispersed solution of the resin composition was obtained.

A photovoltaic element 415 the same as that according to Example 14 was dipped in the foregoing dispersed solution, removed from the same and heated at 150° C. for one hour to be hardened. As a result, a solar cell 416 having a sealing film, the thickness of which was 100 μm, and which was formed on the entire photoelectric conversion surface and the entire backside thereof, was obtained, the solar cell being schematically shown in FIG. 4.

Comparative Example 18

Sealing was performed similarly to Example 15 except for that urethane rubber particles serving as light transmissive particles were not used but only the resin was used.

The conversion efficiency and the surface hardness of the solar cells according to Example 15 and Comparative Example 18 were evaluated. The results are shown in Table 13. As shown in Table 13, the sample according to Example 15 exhibited superior flexibility and various other characteristics compared to those of Comparative Example 18. The sample according to Comparative Example 18 encountered cracks and breakage of the front surface electrode due to the disadvantage of the thermoplastic phenol resin. Therefore, the characteristics required for a usable solar cell could not be realized. The sample according to Example 15 contained the urethane rubber particles, whereby a sealing film which exhibited excellent flexibility was obtained while overcoming the foregoing problems. The sample according to Example 15 exhibited superior resistance against high temperatures and high humidity deterioration compared to that of Comparative Example 18. The reason for this is that the sample according to Example 15 had significantly improved uniformity of the sealing film. Therefore, the film thickness reduction in the peripheral portion of the photovoltaic element and in the portion over the front surface electrode can be prevented. As a result, excessive deterioration in the conversion efficiency was prevented.

EXAMPLE 16

70 parts by weight of thermosetting phenol resin, the number average molecular weight of which was 600, 30 parts by weight of acrylic resin, the number average molecular weight of which was 12,000 and 100 parts by weight of spherical glass beads, the oil absorption quantity of which was 50 g/100 g, the average particle size of which was 60 μm and which were light transmissive, were uniformly dissolved and dispersed in 30 parts by weight of methylethyl ketone. As a result, a dispersed solution of the resin composition was obtained.

Figure 5:
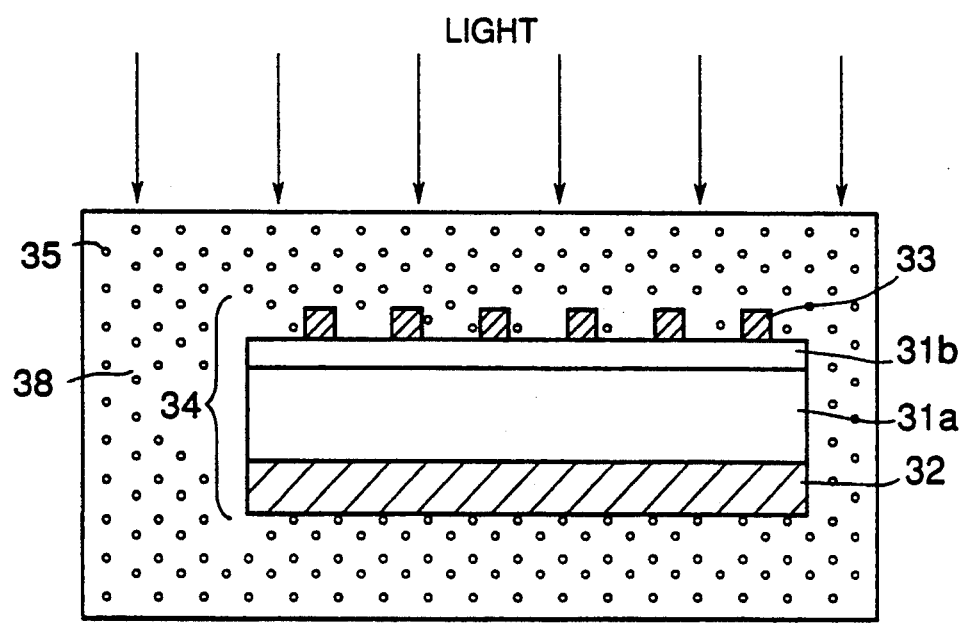
FIG. 5 is a schematic cross sectional view which illustrates another example of a solar cell which uses a sealing material according to the present invention.

A photovoltaic element 34 the same as that according to Example 13 was dipped in the foregoing dispersed solution, removed from the same, and dried at 150° C. for 30 minutes. As a result, a solar cell 34 schematically shown in FIG. 5 was obtained, the solar cell having a sealing film 38, the thickness of which was 80 μm and which was formed on the entire surface of the photoelectric conversion surface and the entire surface of the backside.

Comparative Example 19

Sealing was performed similar to Example 16 except that glass beads serving as light transmissive particles were not used but only resin was used.

The conversion efficiency and the surface hardness of the solar cells according to Example 16 and Comparative Example 19 were evaluated. The results are shown in Table 13. As shown in Table 13, the sample according to Example 16 exhibited superior resistance against high temperatures and high humidity deterioration compared to that according to Comparative Example 19. The reason for this is that the sample according to Comparative Example 19 encountered film thickness reduction in the peripheral portion of the photovoltaic element and in the portion over the front surface electrode but the sample according to Example 16 did not have such reductions in the thickness. Further, the hardness was improved, the damage resistance was further improved, and reduction in the conversion efficiency in the weathering test was prevented.

EXAMPLE 17

20 parts by weight of thermosetting melamine resin, the number average molecular weight of which was 300, 30 parts by weight of acrylic resin, the number average molecular weight of which was 300, 50 parts by weight of a thermoplastic polyvinyl alcohol resin, the number average molecular weight of which was 3000, 50 parts by weight of a thermoplastic polyvinyl alcohol resin, the number average molecular weight of which was 8000, and 30 parts by weight of spherical titanium oxide particles, the oil absorption quantity of which was 30 g/100 g, the average particle size of which was 0.017 μm, and which were light transmissive, were uniformly dissolved and dispersed in a liquid composed of 40 parts by weight of water and 20 parts by weight of ethyl alcohol. As a result, a dispersed solution of the resin composition was obtained.

A similar photovoltaic element 415 as that according to Example 14 was dipped in the foregoing dispersed solution, removed from the same, and dried at 180° C. for 30 minutes. As a result, a solar cell schematically shown in FIG. 4 was obtained, the solar cell having a sealing film 416, the thickness of which was 50 μm and which was formed on the entire surface of the photoelectric conversion surface and the entire surface of the backside.

Comparative Example 20

Sealing was performed similarly to Example 17 except that titanium oxide particles serving as light transmissive particles were not used but only the resin was used. The conversion efficiency and the surface hardness of the solar cells according to Example 17 and Comparative Example 20 were evaluated. As a result, the sample according to Example 17 exhibited superior results because of the same reason as that described in Example 16.

EXAMPLE 18

70 parts by weight of unsaturated polyester hardening resin, the number average molecular weight of which was 2000, 2 parts by weight of di-t-butyloxide, 30 parts by weight of a thermoplastic polycarbonate resin, the number average molecular weight of which was 10,000, and 30 parts by weight of urethane rubber particles, the oil absorption quantity of which was 50 g/100 g, the average particle size of which was 50 μm and which were light transmissive, were uniformly dissolved and dispersed with 50 parts by weight of dichloromethane. As a result, a dispersed solution of the resin composition was obtained.

A similar photovoltaic element 415 as that according to Example 14 was dipped in the foregoing dispersed solution, removed from the same, and dried at 180° C. for 30 minutes. As a result, a solar cell schematically shown in FIG. 4 was obtained, the solar cell having a sealing film 416, the thickness of which was 70 μm and which was formed on the entire surface of the photoelectric conversion surface and the entire surface of the backside.

Comparative Example 21

Sealing was performed similarly to Example 18 except that urethane rubber particles serving as light transmissive particles were not used but only the resin was used. The conversion efficiency and the surface hardness of the solar cells according to Example 18 and Comparative Example 21 were evaluated. The results are shown in Table 13. As shown in Table 13, the sample according to Example 18 exhibited superior characteristics, for example the flexibility, to those of Comparative Example 21. Since the resistance to mechanical distortion of the combination of the hardening resin and the thermoplastic resin is unsatisfactory, the sample according to Comparative Example 21 experienced somewhat considerable generation of cracks and a partial breakage of the front surface electrode. Therefore, the solar cell characteristics deteriorated as compared with Example 18. The sample according to Example 18 provided a sealing film exhibiting excellent flexibility due to the addition of the urethane rubber particles while overcoming the foregoing problems. Example 18 resulted in superior resistance against deterioration due to high temperatures and high humidity compared to that exhibited by Comparative Example 21. The reason for this is that Example 18 had significantly improved uniformity of the sealing film. As a result, the film thickness reduction in the peripheral portion of the photovoltaic element and in the portion over the front surface electrode was prevented. Therefore, deterioration in the conversion efficiency was significantly prevented.

EXAMPLE 19

70 parts by weight of acrylate ester oligomer hardening resin, the number average molecular weight of which was 400, 30 parts by weight of styrene thermoplastic resin, the number average molecular weight of which was 15,000, and 100 parts by weight of spherical glass beads, the oil absorption quantity of which was 20 g/100 g, the average particle size of which was 60 μm and which were light transmissive, were uniformly dissolved and dispersed in 40 parts by weight of methylethyl ketone. As a result, a dispersed solution of the resin composition was obtained.

A similar photovoltaic element 34 as that according to Example 13 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 5 was obtained, the solar cell having a sealing film 38, the thickness of which was 80 μm and which was formed on the entire surface of the photoelectric conversion surface and the entire surface of the backside.

Comparative Example 22

Sealing was performed similarly to Example 19 except that glass beads serving as light transmissive particles were not used but only resin was used.

The conversion efficiency and the surface hardness of the solar cells according to Example 19 and Comparative Example 22 were evaluated. As a result, the sample according to Example 19 exhibited superior results as shown in Table 13 to Comparative Example 22 because of the same reason as that described in Example 16.

EXAMPLE 20

50 parts by weight of acrylate epoxy oligomer hardening resin, the number average molecular weight of which was 600, 50 parts by weight of styrene butadiene thermoplastic resin (monomer composition: styrene/butadiene=80/20), the number average molecular weight of which was 8000, and 30 parts by weight of spherical titanium oxide particles, the oil absorption quantity of which was 30 g/100 g, the average particle size of which was 0.017 $\mu$m and which were light transmissive, were uniformly dissolved and dispersed in 60 parts by weight of ethyl acetate ester. As a result, a dispersed solution of the resin composition was obtained.

A similar photovoltaic element 415 as that according to Example 14 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 4 was obtained, the solar cell having a sealing film 416, the thickness of which was 50 $\mu$m and which was formed on the entire surface of the photoelectric conversion surface and the entire surface of the backside.

Comparative Example 23

Sealing was performed similarly to Example 20 except that titanium oxide particles serving as light transmissive particles were not used but only the resin was used.

The conversion efficiency and the surface hardness of the solar cells according to Example 20 and Comparative Example 23 were evaluated. As a result, the sample according to Example 20 exhibited superior results as shown in Table 13 compared to Comparative Example 23 because of the same reason as that described in Example 16.

EXAMPLE 21

60 parts by weight of acrylate urethane oligomer hardening resin, the number average molecular weight of which was 200, 40 parts by weight of styrene thermoplastic resin, the number average molecular weight of which was 20,000, and 65 parts by weight of urethane rubber particles, the oil absorption quantity of which was 50 g/100 g, the average particle size of which was 50 $\mu$m and which were light transmissive, were uniformly dissolved and dispersed in 50 parts by weight of toluene. As a result, a dispersed solution of the resin composition was obtained.

A similar photovoltaic element 415 as that according to Example 14 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 4 was obtained, the solar cell having a sealing film 416, the thickness of which was 70 $\mu$m and which was formed on the entire surface of the photoelectric conversion surface and the entire surface of the backside.

Comparative Example 24

Sealing was performed similarly to Example 21 except that urethane rubber particles serving as light transmissive particles were not used but only the resin was used.

The conversion efficiency as the surface hardness of the solar calls according to Example 21 and Comparative Example 24 were evaluated. As a result, the sample according to Example 21 exhibited superior results as shown in Table 13 compared to Comparative Example 24 because of the same reason as that described in Example 18.

EXAMPLE 22

70 parts by weight of acrylate ester oligomer hardening resin, the number average molecular weight of which was 400, 30 parts by weight of acrylic thermoplastic resin, the monomer composition of which was methyl methacrylate/butyl methacrylate/acrylic acid=30/60/10, the number average molecular weight of which was 10,000 and 100 parts by weight of spherical glass beads, the oil absorption quantity of which was 20 g/100 g, the average particle size of which was 60 $\mu$m and which were light transmissive, were uniformly dissolved and dispersed in 40 parts by weight of methylethyl ketone. As a result, a dispersed solution of the resin composition was obtained.

A similar photovoltaic element 34 as that according to Example 13 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 5 was obtained, the solar cell having a sealing film 38, the thickness of which was 80 $\mu$m and which was formed on the entire surface of the photoelectric conversion surface and the entire surface of the backside.

Comparative Example 25

Sealing was performed similarly to Example 22 except that glass beads serving as light transmissive particles were not used but only the resin was used.

The conversion efficiency and the surface hardness of the solar cells according to Example 22 and Comparative Example 25 were evaluated. As a result, the sample according to Example 22 exhibited superior results as shown in Table 13 compared to Comparative Example 25 because of the same reason as that described in Example 16.

EXAMPLE 23

50 parts by weight of acrylate ester oligomer hardening resin, the number average molecular weight of which was 600, 50 parts by weight of acrylic thermoplastic resin, the monomer composition of which was methyl acrylate/butyl methacrylate/methacrylic acid=50/35/15, the number average molecular weight of which was 15,000, and 30 parts by weight of spherical titanium oxide, the oil absorption quantity of which was 30 g/100 g, the average particle size of which was 0.017 $\mu$m, and which were light transmissive, were uniformly dissolved and dispersed in 60 parts by weight of ethyl acetate ester. As a result, a dispersed solution of the resin composition was obtained.

A similar photovoltaic element 415 as that according to Example 14 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 4 was obtained, the solar cell having a sealing film 416, the thickness of which was 50 $\mu$m and which was formed on the entire surface of the photoelectric conversion surface and the entire surface of the backside.

Comparative Example 26

Sealing was performed similarly to Example 23 except that titanium oxide particles serving as light transmissive particles were not used but only the resin was used.

The conversion efficiency and the surface hardness of the solar cells according to Example 23 and Comparative Example 26 were evaluated. As a result, the sample according to Example 23 exhibited superior results as shown in Table 13 compared to Comparative Example 26 because of the same reason as that described in Example 16.

EXAMPLE 24

60 parts by weight of acrylate urethane oligomer hardening resin, the number average molecular weight of which was 200, 40 parts by weight of acrylic thermoplastic resin, the monomer composition of which was butyl methacrylate/methacrylic acid=80/20, the number average molecular weight of which was 20,000, and 65 parts by weight of urethane rubber particles, the oil absorption quantity of which was 50 g/100 g, the average particle size of which was 50 $\mu$m and which were light transmissive, were uniformly dissolved and dispersed in 50 parts by weight of toluene. As a result, a dispersed solution of the resin composition was obtained.

A similar photovoltaic element 415 as that according to Example 14 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 4 was obtained, the solar cell having a sealing film 416, the thickness of which was 70 $\mu$m and which was formed on the entire surface of the photoelectric conversion surface and the entire surface of the backside.

Comparative Example 27

Sealing was performed similarly to Example 24 except that urethane rubber particles serving as light transmissive particles were not used but only the resin was used.

The conversion efficiency and the surface hardness of the solar cells according to Example 24 and Comparative Example 27 were evaluated. The results are shown in Table 13. the sample according to Example 24 exhibited superior results as shown in Table 13 compared to Comparative Example 27 because of the same reason as that described in Example 18.

EXAMPLE 25

70 parts by weight of acrylate ester oligomer hardening resin, the number average molecular weight of which was 400, 30 parts by weight of acrylic thermoplastic resin, the monomer composition of which was styrene/methyl methacrylate/butyl methacrylate/acrylic acid=20/30/40/10, the number average molecular weight of which was 10,000, and 100 parts by weight of spherical glass beads, the oil absorption quantity of which was 20 g/100 g, the average particle size of which was 60 $\mu$m and which were light transmissive, were uniformly dissolved and dispersed in 50 parts by weight of methylethyl ketone. As a result, a dispersed solution of the resin composition was obtained.

A similar photovoltaic element 34 as that according to Example 13 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 5 was obtained, the solar cell having a sealing film 38, the thickness of which was 80 $\mu$m and which was formed on the entire surface of the photoelectric conversion surface and the entire surface of the backside.

Comparative Example 26

Sealing was performed similarly to Example 25 except that glass beads serving as light transmissive particles were not used but only the resin was used.

The conversion efficiency and the surface hardness of the solar cells according to Example 25 and Comparative Example 28 were evaluated. As a result, the sample according to Example 25 exhibited superior results as shown in Table 13 compared to Comparative Example 28 because of the same reason as that described in Example 16.

Comparative Example 26

50 parts by weight of acrylate epoxy oligomer hardening resin, the number average molecular weight of which was 600, 50 parts by weight of acrylic thermoplastic resin, the monomer composition of which was styrene/methyl acrylate/butyl methacrylate/methacrylic acid=20/30/35/15, the number average molecular weight of which was 15,000, and 30 parts by weight of spherical titanium oxide particles, the oil absorption quantity of which was 30 g/100 g, the average particle size of which was 0.017 $\mu$m and which were light transmissive, were uniformly dissolved and dispersed in 60 parts by weight of ethyl acetate ester. As a result, a dispersed solution of the resin composition was obtained.

A similar photovoltaic element 415 as that according to Example 14 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 4 was obtained, the solar cell having a sealing film 416, the thickness of which was 50 $\mu$m and which was formed on the entire surface of the photoelectric conversion surface and the entire surface of the backside.

Comparative Example 29

Sealing was performed similarly to Example 26 except that titanium oxide particles serving as light transmissive particles were not used but only the resin was used.

The conversion efficiency and the surface hardness of the solar cells according to Example 26 and Comparative Example 29 were evaluated. As a result, the sample according to Example 26 exhibited superior results as shown in Table 13 compared to Comparative Example 29 because of the same reason as that described in Example 16.

EXAMPLE 27

60 parts by weight of acrylate urethane oligomer hardening resin, the number average molecular weight of which was 200, 40 parts by weight of styrene acrylic thermoplastic resin, the monomer composition of which was styrene/ethyl acrylate/butyl methacrylate/methacrylic acid=30/30/20/20, the number average molecular weight of which was 20,000, and 65 parts by weight of monolithic urethane particles, the oil absorption quantity of which was 50 g/100 g, the average particle size of which was 50 μm and which were light transmissive, were uniformly dissolved and dispersed in 50 parts by weight of toluene. As a result, a dispersed solution of the resin composition was obtained.

A similar photovoltaic element 415 as that according to Example 14 was dipped in the foregoing dispersed solution, removed from the same, and dried at 100° C. for 20 minutes. High voltage mercury lamp radiation of 365 nm was applied at 50 mW/cm$^2$ for 30 seconds. As a result, a solar cell schematically shown in FIG. 4 was obtained, the solar cell having a sealing film 416, the thickness of which was 70 μm and which was formed on the entire surface of the photoelectric conversion surface and the entire surface of the backside.

Comparative Example 30

Sealing was performed similarly to Example 27 except that urethane rubber particles serving as light transmissive particles were not used but only the resin was used.

The conversion efficiency and the surface hardness of the solar cells according to Example 27 and Comparative Example 30 were evaluated. As a result, the sample according to Example 27 exhibited superior results as shown in Table 13 compared to Comparative Example 30 because of the same reason as that described in Example 18.

The evaluation items shown in Table 13 relating to Examples 13 to 27 and Comparative Examples 15 to 30 were obtained as follows.

Initial conversion efficiency: the conversion efficiency of a solar cell measured immediately after it has been manufactured.

Weather resistance: the conversion efficiency measured after a weathering test had been performed for 1000 hours by using a sunshine weather meter.

Surface hardness: measured according to JIS 5400 (pencil test).

Damage resistance: a damage was made by using a sharp article and evaluated as follows:
◯: no abnormality was found
Δ: slight damage was found
×: damage can be found High temperature and high humidity deterioration test: the conversion efficiency measured after the sample was allowed to stand at a temperature of 85° C. and a humidity of 85 RH% for 100 hours.

Flexibility: evaluated by a method conforming to JIS Z2248 in accordance with the following criteria:
◯: no abnormality was found
Δ: slight damage was found
×: damage can be found

TABLE 13-1

|  | Initial Conversion Efficiency | Weathering Resistance (Conversion Efficiency After 1000 Hours) | Surface Hardness | Damage Resistance | High Temperature and High Humidity Resistance | Flexibility |
| --- | --- | --- | --- | --- | --- | --- |
| Example 13 | 13% | 12.8% | 2 H | ◯ | — | — |
| Comparative Example 16 | 0% | 0% | 2 H | × |  |  |
| Example 14 | 8% | 7.0% | 4 H | ◯ | 8% | — |
| Comparative Example 17 | 8% | 6.5% | 2 H | × | 4% |  |
| Example 15 | 8% | 6.8% | 4 H | ◯ | 8% | ◯ |
| Comparative Example 18 | 8% | 6.0% | 4 H | Δ | 2% | × |
| Example 16 | 13% | 11.8% | 7 H | ◯ | 13% | — |
| Comparative Example 19 | 13% | 10.5% | 4 H | Δ | 6% |  |
| Example 17 | 8% | 7.2% | 7 H | ◯ | 8% | — |
| Comparative Example 20 | 8% | 6.6% | 4 H | Δ | 3% |  |
| Example 18 | 8% | 7.2% | 7 H | ◯ | 8% | ◯ |
| Comparative Example 21 | 8% | 6.8% | 6 H | Δ | 3% | Δ |

TABLE 13-2

|  | Initial Conversion Efficiency | Weathering Resistance (Conversion Efficiency After 1000 Hours) | Surface Hardness | Damage Resistance | High Temperature and High Humidity Resistance | Flexibility |
| --- | --- | --- | --- | --- | --- | --- |
| Example 19 | 13% | 12.5% | 7 H | ◯ | 13% | — |
| Comparative Example 22 | 13% | 12.0% | 4 H | Δ | 3% |  |
| Example 20 | 8% | 7.5% | 5 H | ◯ | 8% | — |
| Comparative Example 23 | 8% | 7.0% | 3 H | Δ | 3% |  |
| Example 21 | 8% | 7.5% | 6 H | ◯ | 8% | ◯ |
| Comparative Example 24 | 8% | 7.0% | 5 H | Δ | 3% | × |
| Example 22 | 13% | 12.6% | 7 H | ◯ | 13% | — |
| Comparative Example 25 | 13% | 12.3% | 5 H | Δ | 3% |  |

TABLE 13-2-continued

|  | Initial Conversion Efficiency | Weathering Resistance (Conversion Efficiency After 1000 Hours) | Surface Hardness | Damage Resistance | High Temperature and High Humidity Resistance | Flexibility |
|---|---|---|---|---|---|---|
| Example 23 | 8% | 7.5% | 6 H | ◯ | 8% | — |
| Comparative Example 26 | 8% | 7.0% | 4 H | △ | 3% |  |
| Example 24 | 8% | 7.5% | 6 H | ◯ | 8% | ◯ |
| Comparative Example 27 | 8% | 7.0% | 5 H | △ | 3% | X |
| Example 25 | 13.3% | 12.9% | 7 H | ◯ | 13.3% | — |
| Comparative Example 28 | 13.3% | 12.6% | 6 H | △ | 3% |  |

TABLE 13-3

|  | Initial Conversion Efficiency | Weathering Resistance (Conversion Efficiency After 1000 Hours) | Surface Hardness | Damage Resistance | High Temperature and High Humidity Resistance | Flexibility |
|---|---|---|---|---|---|---|
| Example 26 | 8.4% | 7.9% | 6 H | ◯ | 8.4% | — |
| Comparative Example 29 | 8.4% | 7.6% | 5 H | △ | 3% |  |
| Example 27 | 8.4% | 7.9% | 6 H | ◯ | 8.4% | ◯ |
| Comparative Example 30 | 8.4% | 7.6% | 6 H | △ | 3% | X |

The sealing material according to each of the Examples exhibited excellent characteristics such as surface hardness, light transmissivity and adhesion. Further, deterioration can be significantly prevented.

In addition, the samples according to the Examples of the present invention exhibited excellent results in various accelerated tests simulating actual use of the solar cell, for example, a cyclic test composed of hot and cold conditions, a high temperature resistance test and a water dipping test.

Moreover, it was found that the solar cells according to the present invention are able to be operated stably for along time while exhibiting excellent characteristics.

Since the present invention utilizes a sealing material for a solar cell, photosensor, or display which is composed of a hardening resin and a thermoplastic resin which has a number average molecular weight larger than that of the hardening resin and which is soluble in the hardening resin, a solar cell, a photosensor and a display, which can be operated stably for a long time while exhibiting excellent performance, can be provided.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A sealed semiconductor device comprising:
a resin composition for sealing composed of a hardening resin and a thermoplastic resin which has a number average molecular weight larger than the number average molecular weight of said hardening resin, wherein said resin composition for sealing is disposed on a photoelectric conversion surface or a non-photoelectric conversion surface of said semiconductor device.

2. A semiconductor device according to claim 1, wherein the number average molecular weight of said hardening resin is 3000 or less.

3. A semiconductor device according to claim 1, wherein the number average molecular weight of said thermoplastic resin is 5000 or more.

4. A semiconductor device according to claim 1, wherein said hardening resin is a polymer having an acrylic group or an acrylic group which has a substituent at the $\alpha$ or $\beta$ position and said thermoplastic resin is a styrene polymer.

5. A semiconductor device according to claim 1, wherein said hardening resin is a polymer having an acrylic group or an acrylic group which has a substituent at the $\alpha$ or $\beta$ position and said thermoplastic resin is an acrylic polymer.

6. A semiconductor device according to claim 1, wherein said hardening resin is a polymer having an acrylic group or an acrylic group which has a substituent at the $\alpha$ or $\beta$ position and said thermoplastic resin is a styrene acrylic polymer.

7. A semiconductor device according to claim 1, wherein said semiconductor apparatus is a solar cell.

8. A semiconductor device according to claim 7, wherein said solar cell is a non-single crystalline solar cell.

9. A semiconductor device according to claim 8, wherein said non-single crystalline solar cell is an amorphous solar cello 10. A semiconductor device according to claim 7, wherein said solar cell has a pin junction.

11. A semiconductor device according to claim 7, wherein said solar cell has a collecting electrode formed by thermally hardening a conductive paste.

12. A sealed semiconductor device comprising:
at least a portion of said device covered with a resin composition comprising at least one type of resin selected from a group consisting of a hardening resin and a thermoplastic resin and light transmissive particles as the main components, wherein the total content of said at least one resin is 1.5 times or more the quantity of oil absorbed in said light transmissive particles.

13. A semiconductor device according to claim 12, wherein said semiconductor device is a solar cell.

14. A semiconductor device according to claim 13, wherein said solar cell is a non-single crystalline solar cell.

15. A semiconductor device according to claim 14, wherein said non-single crystalline solar cell is an amorphous solar cell.

16. A semiconductor device according to claim 13, wherein said solar cell has a pin junction.

17. A semiconductor device according to claim 13, wherein said solar cell has a collecting electrode formed by thermally hardening a conductive paste.

18. A semiconductor device comprising at least a portion of said semiconductor device being coated with a resin composition for sealing, said sealing composition comprising:

a hardening resin having reactivity and a relatively low molecular weight;

a thermoplastic resin which has a number average molecular weight larger than the number average molecular weight of said hardening resin and which is soluble in said hardening resin; and light transmissive particles, wherein the proportion of the total contents of said hardening resin and said thermoplastic resin is 1.5 times or more the quantity of oil absorbed in said light transmissive particles.

19. A semiconductor device according to claim 18, wherein said semiconductor device is a solar cell.

20. A semiconductor device according to claim 19, wherein said solar cell is a non-single crystalline solar cell.

21. A semiconductor device according to claim 20, wherein said non-single crystalline solar cell is an amorphous solar cell.

22. A semiconductor device according to claim 19, wherein said solar cell has a pin junction.

23. A semiconductor device according to claim 19, wherein said solar cell has a collecting electrode formed by thermally hardening a conductive paste.

* * * * *

UNITED STATES PATENT AND TRADEMARK OFFICE
CERTIFICATE OF CORRECTION

PATENT NO. : 5,397,401
DATED : March 14, 1995
INVENTOR(S) : HITOSHI TOMA, ET AL.

It is certified that error appears in the above-identified patent and that said Letters Patent is hereby corrected as shown below:

COLUMN 4

Line 11, "that" should read --than--.

COLUMN 9

Line 44, "an" should read --can--.

COLUMN 12

Line 19, "due" should read --due to--.

COLUMN 17

Line 43, "was-formed." should read --was formed.--.

COLUMN 21

Line 68, "a i-type" should read --an i-type--.

COLUMN 23

Line 21, "Weight" should read --weight--.

COLUMN 26

Line 20, "characteristics-and" should read --characteristics and--.

COLUMN 28

Line 64, "film 18" should read --film 418--.

UNITED STATES PATENT AND TRADEMARK OFFICE
CERTIFICATE OF CORRECTION

PATENT NO. : 5,397,401
DATED : March 14, 1995
INVENTOR(S) : HITOSHI TOMA, ET AL.

It is certified that error appears in the above-identified patent and that said Letters Patent is hereby corrected as shown below:

COLUMN 29

Line 52, "weight-of" should read --weight of--.

COLUMN 32

Line 6, "used.  The" should read --used. ¶ The--.

COLUMN 34

Line 2, "calls" should read --cells--.

COLUMN 39

Line 42, "along" should read --a long--.

COLUMN 40

Line 58, "cello" should read --cell.--.

Signed and Sealed this

Twentieth Day of June, 1995

BRUCE LEHMAN

Attest:

Attesting Officer

Commissioner of Patents and Trademarks